US012606904B2

(12) United States Patent
Yakushiji et al.

(10) Patent No.: US 12,606,904 B2
(45) Date of Patent: Apr. 21, 2026

(54) FILM FORMING APPARATUS, CONTROL APPARATUS FOR FILM FORMING APPARATUS, AND FILM FORMING METHOD

(71) Applicant: CANON ANELVA CORPORATION, Kanagawa (JP)

(72) Inventors: Hiroshi Yakushiji, Kanagawa (JP); Reiji Sakamoto, Kanagawa (JP); Masahiro Shibamoto, Kanagawa (JP)

(73) Assignee: CANON ANELVA CORPORATION, Kanagawa (JP)

( * ) Notice: Subject to any disclaimer, the term of this patent is extended or adjusted under 35 U.S.C. 154(b) by 613 days.

(21) Appl. No.: 17/941,389

(22) Filed: Sep. 9, 2022

(65) Prior Publication Data

US 2023/0002886 A1 Jan. 5, 2023

Related U.S. Application Data

(63) Continuation of application No. PCT/JP2020/041999, filed on Nov. 11, 2020.

(30) Foreign Application Priority Data

Apr. 1, 2020 (JP) ................................. 2020-065522

(51) Int. Cl.
*C23C 14/58* (2006.01)
*C23C 14/06* (2006.01)
(Continued)

(52) U.S. Cl.
CPC ...... *C23C 14/5833* (2013.01); *C23C 14/0641* (2013.01); *C23C 14/18* (2013.01);
(Continued)

(58) Field of Classification Search
CPC . C23C 14/5833; C23C 14/0641; C23C 14/18; C23C 14/3464; C23C 14/505;
(Continued)

(56) References Cited

U.S. PATENT DOCUMENTS 4,244,798 A * 1/1981 Gold ....................... C03C 17/09
204/192.15
6,720,659 B1 4/2004 Akahori
(Continued)

FOREIGN PATENT DOCUMENTS

CN 1938448 A 3/2007
CN 101492811 A 7/2009
(Continued)

OTHER PUBLICATIONS

Office Action issued Oct. 12, 2023, in counterpart application TW 112133612 (19 pages).
(Continued)

*Primary Examiner* — Patrick S Ott
(74) *Attorney, Agent, or Firm* — VENABLE LLP

(57) ABSTRACT

A film forming apparatus has a process chamber and a processing unit provided in the process chamber and forming adhesive film. The surface of the inner walls of the process chamber is formed of a material having a large getter effect on gas or water ($H_2O$) remaining in the process chamber.

6 Claims, 19 Drawing Sheets

(51) Int. Cl.

| | | |
|---|---|---|
| *C23C 14/18* | (2006.01) | |
| *C23C 14/34* | (2006.01) | |
| *C23C 14/50* | (2006.01) | |
| *C23C 14/54* | (2006.01) | |

(52) U.S. Cl.
CPC ........ *C23C 14/3464* (2013.01); *C23C 14/505* (2013.01); *C23C 14/541* (2013.01); *C23C 14/5873* (2013.01)

(58) Field of Classification Search
CPC ... C23C 14/541; C23C 14/5873; C23C 14/34; C23C 14/46; C23C 14/185; C23C 14/54; C23C 14/564; C23C 14/025; C23C 14/3407; C23C 14/3442; C23C 14/568; C23C 14/566; H01J 37/32449; H01J 37/32724; H01J 37/32871
See application file for complete search history.

(56) References Cited

U.S. PATENT DOCUMENTS

| | | | |
|---|---|---|---|
| 8,057,856 | B2 | 11/2011 | Cheong et al. |
| 9,101,067 | B2 | 8/2015 | Ishizaka et al. |
| 9,768,260 | B2 | 9/2017 | Kinoshita et al. |
| 9,790,590 | B2 | 10/2017 | Furukawa et al. |
| 10,014,362 | B2 | 7/2018 | Jo et al. |
| 10,153,135 | B2 | 12/2018 | Wilby et al. |
| 10,515,848 | B1 | 12/2019 | Kuo et al. |
| 10,658,234 | B2 | 5/2020 | Hung et al. |
| 10,738,380 | B2 | 8/2020 | Nozawa et al. |
| 10,840,129 | B2 | 11/2020 | Kuo et al. |
| 10,879,224 | B2 | 12/2020 | Chen et al. |
| 11,387,191 | B2 | 7/2022 | Yu et al. |
| 11,404,308 | B2 | 8/2022 | Kuo et al. |
| 11,600,469 | B2 | 3/2023 | Takeda et al. |
| 11,784,030 | B2 | 10/2023 | Takeda et al. |
| 2002/0024138 | A1 | 2/2002 | Shimoto et al. |
| 2003/0207030 | A1* | 11/2003 | Conte ................... C23C 14/564 427/299 |
| 2005/0227005 | A1 | 10/2005 | Cheong et al. |
| 2006/0269656 | A1 | 11/2006 | Boroson et al. |
| 2008/0100915 | A1* | 5/2008 | Wu ..................... C23C 16/0245 359/589 |
| 2009/0081434 | A1* | 3/2009 | Sturland ................. C23C 14/54 204/192.12 |
| 2009/0169923 | A1 | 7/2009 | Yamamoto et al. |
| 2010/0326709 | A1 | 12/2010 | Kawano et al. |
| 2011/0204519 | A1 | 8/2011 | Chikaki et al. |
| 2014/0175046 | A1 | 6/2014 | Ishizaka et al. |
| 2015/0056786 | A1 | 2/2015 | Kinoshita et al. |
| 2015/0187546 | A1* | 7/2015 | Furukawa ........... H01J 37/3447 204/192.12 |
| 2016/0379807 | A1 | 12/2016 | Wilby et al. |
| 2017/0009338 | A1* | 1/2017 | Saito .................. H01J 37/32119 |
| 2017/0077213 | A1 | 3/2017 | Jo et al. |
| 2017/0211179 | A1* | 7/2017 | Nozawa ............... H01J 37/3411 |
| 2017/0301368 | A1* | 10/2017 | Kikuchi .................. G11B 5/84 |
| 2019/0287825 | A1* | 9/2019 | Tanaka ............... H01L 21/6833 |
| 2020/0126767 | A1 | 4/2020 | Takeda et al. |
| 2020/0126850 | A1 | 4/2020 | Kuo et al. |
| 2020/0135708 | A1 | 4/2020 | Chen et al. |
| 2020/0312768 | A1 | 10/2020 | Nad et al. |
| 2021/0020584 | A1 | 1/2021 | Yu et al. |
| 2021/0082745 | A1 | 3/2021 | Kuo et al. |
| 2022/0336376 | A1 | 10/2022 | Yu et al. |
| 2023/0005721 | A1 | 1/2023 | Takeda et al. |

FOREIGN PATENT DOCUMENTS

| | | | |
|---|---|---|---|
| CN | 104335328 | A | 2/2015 |
| CN | 104350174 | A | 2/2015 |
| CN | 204898063 | U | 12/2015 |
| CN | 106298423 | A | 1/2017 |
| CN | 106795626 | A | 5/2017 |
| CN | 108300968 | A | 7/2018 |
| CN | 109415804 | A | 3/2019 |
| CN | 1101297961 | A | 8/2019 |
| JP | 2-50959 | A | 2/1990 |
| JP | 4-99271 | A | 3/1992 |
| JP | 6-37074 | A | 2/1994 |
| JP | 7-310180 | A | 11/1995 |
| JP | 8-55804 | A | 2/1996 |
| JP | 9-320963 | A1 | 12/1997 |
| JP | 2010-106290 | A | 5/2010 |
| JP | 2011-195850 | A | 10/2011 |
| JP | 2016-69684 | A | 5/2016 |
| JP | WO2016/056275 | A | 7/2017 |
| JP | 2019-129172 | A | 8/2019 |
| KR | 10-2017-0032524 | A | 3/2017 |
| TW | 403942 | B | 9/2000 |
| TW | 201440152 | A | 10/2014 |
| TW | 202008481 | A | 2/2020 |
| TW | 202015495 | A | 4/2020 |
| TW | 202017131 | A | 5/2020 |
| TW | 202105629 | A | 2/2021 |
| WO | 2016/056275 | A1 | 4/2016 |

OTHER PUBLICATIONS

Office Action issued Jul. 31, 2023, in corresponding TW 112120037 (21 pages).
Office Action dated Feb. 18, 2023, in counterpart TW application No. 111112416 (11 pages).
Office Action issued on Jul. 17, 2024, in corresponding KR 10-2023-7006932 (9 pages).
Office Action issued on Jul. 22, 2024, in corresponding KR 10-2022-7030318 (11 pages).
Office Action dated Jun. 1, 2023, in counterpart TW application No. 111112416 (19 pages).
Office Action issued Jan. 19, 2024, in counterpart application TW 112133612 (23 pages).
Office Action issued Jul. 7, 2023, in corresponding CN 202080099470.1. (20 pages).
Office Action issued in corresponding application TW 110108253 (33 pages).
Office Action issued Jun. 30, 2025 in corresponding TW 114100895 (21 pages).
Office Action in counterpart CN 202311487538.5 dated Nov. 24, 2025 (19 pages).
Office Action dated Feb. 28, 2026, in counterpart CN 202180052501.2 (17 pages).

* cited by examiner

41 — CARRIER TRANSFER PROCESS

42 — GETTER PROCESS

43 — ETCHING PROCESS

44 — TARGET CLEANING OF ADHESIVE FILM PROCESS

45 — ADHESIVE FILM FORMATION PROCESS

46 — TARGET CLEANING OF SEED FILM PROCESS

47 — SEED FILM FORMATION PROCESS

48 — CARRIER EJECTION PROCESS

61 — CARRIER TRANSFER PROCESS

62 — ETCHING PROCESS

63 — TARGET CLEANING OF ADHESIVE FILM PROCESS

64 — ADHESIVE FILM FORMATION PROCESS

65 — TARGET CLEANING OF SEED FILM PROCESS

66 — SEED FILM FORMATION PROCESS

67 — CARRIER EJECTION PROCESS

FILM FORMING APPARATUS, CONTROL APPARATUS FOR FILM FORMING APPARTUS, AND FILM FORMING METHOD

CROSS-REFERENCE TO RELATED APPLICATIONS

This application is a Continuation of International Patent Application No. PCT/JP2020/041999, filed Nov. 11, 2020, which claims the benefit of Japanese Patent Application No. 2020-065522, filed Apr. 1, 2020, both of which are hereby incorporated by reference herein in their entirety.

BACKGROUND OF THE INVENTION

Field of the Invention

The present invention relates to a film forming apparatus for forming a film on the surface of a substrate including a printed circuit board and a film substrate, and to a control apparatus and a film forming method for the film forming apparatus.

In an implementation step of implementing electronic components on substrates including printed circuit boards and film substrates, an adhesive layer serving as a base for wiring connected to the electronic components and a seed layer for forming the wiring by plating are formed. The respective layers are formed by, for example, plating or sputtering.

Description of the Related Art

For example, Japanese Patent Application Laid-Open No. H07-310180 discloses a method for forming a thin film under a low-pressure rare gas environment, which comprises a gas evacuating/replacing step of evacuating gas in a vacuum chamber by vacuum drawing and then introducing a rare gas into the vacuum chamber, and a film forming step of forming a thin film forming material on an adherend under a rare gas environment, in order to form a thin film having excellent adhesion in a short time. A thin film forming method is described in which the film forming step is performed after the gas evacuation/substitution step is performed at least twice or more.

However, in the thin film forming method described in Japanese Patent Application Laid-Open No. H07-310180, hydrogen and oxygen due to water (H2O) gas are mixed in the interface between the adhesive film and the substrate and in the adhesive film, and sufficient adhesion between the adhesive film and the substrate cannot be obtained.

In Japanese Patent Application Laid-Open No. H02-050959, in order to form a pure rare earth metal thin film, a rare earth metal thin film forming apparatus is described in which a main cathode on which a main target of a rare earth metal is mounted, a substrate held by a substrate holder at a position opposed to the main target of the rare earth metal, an auxiliary cathode on which an active metal auxiliary target is mounted facing the inner wall of the chamber at a side position of the substrate holder are respectively installed in a vacuum chamber of a magnetron type sputtering apparatus, and an inert gas introducing tube is mounted on a vacuum chamber wall.

However, in the film forming apparatus described in Japanese Patent Application Laid-Open No. H02-050959, the auxiliary cathode to which the active metal auxiliary target is attached faces the inner wall side of the chamber at a side position of the substrate and the substrate holder, so that the auxiliary cathode is insufficient as a getter for capturing residual oxygen, nitrogen, and the like in a space other than the inner wall side of the chamber.

An object of the present invention is to provide a film forming apparatus, a control apparatus for the film forming apparatus, and a film forming method which can improve the adhesion between a substrate and an adhesive film without lowering productivity.

SUMMARY OF THE INVENTION

According to one example aspect of the present invention recited in claim 1, a film forming apparatus comprises a process chamber and a processing unit provided in the process chamber for forming adhesive films on substrates, wherein surface of the inner wall of the process chamber is formed of a material having a large getter effect on gas or water ($H_2O$) remaining in the process chamber.

According to another example aspect of the present invention recited in claim 5, a control apparatus for controlling a film forming apparatus comprises a process chamber, a processing unit provided in the process chamber configured to form adhesive films on substrates, an exhaust unit capable of evacuating the process chamber, and a gas introduction unit introducing gas for forming the adhesive films in the process chamber, wherein the control apparatus further comprises a storing unit storing a control program, and wherein the control program comprises a first step of forming, in the process chamber, a material having a large getter effect on gas or water ($H_2O$) remaining in the process chamber, a second step of exhausting the process chamber for a predetermined period of time after the first step, a third step of forming, in the process chamber, the material having a large getter effect on gas or water ($H_2O$) remaining in the process chamber after the second step, a fourth step of exhausting the process chamber for a predetermined period of time after the third step, and an adhesive film forming step of forming adhesive films on the substrates provided in the process chamber after the fourth step, wherein the exhaust unit and the gas introduction unit are controlled so that duty cycle $D=P1/P$ becomes 34% or more and 66% or less, when P1 is a time of the first step or the third step and P is a total time of the first step and the second step or a total time of the third step and fourth step.

According to another example aspect of the present invention, film forming method comprises a first step of forming, in a process chamber, a material having a large getter effect on gas or water ($H_2O$) remaining in the process chamber, a second step of exhausting the process chamber for a predetermined period of time after the first step, a third step of forming, in the process chamber, the material having a large getter effect on gas or water ($H_2O$) remaining in the process chamber after the second step, a fourth step of exhausting the process chamber for a predetermined period of time after the third step, and an adhesive film forming step of forming adhesive films on substrates provided in the process chamber after the fourth step.

Further features of the present invention will become apparent from the following description of exemplary embodiments with reference to the attached drawings.

BRIEF DESCRIPTION OF THE DRAWINGS

FIG. 2 is a diagram showing a schematic configuration of a control system in a process chamber of a film forming apparatus according to a first embodiment of the present invention.

FIG. 6 is a diagram showing a specific operation example of a film formation procedure of example 1-1, example 1-2, and example 1-3 of the first embodiment of the present invention.

DESCRIPTION OF THE EMBODIMENTS

The present inventors have found the present invention from the following findings. The knowledge of the inventor will be described with reference to FIGS. 1, 2 and 3.

First Embodiment

Figure 1:
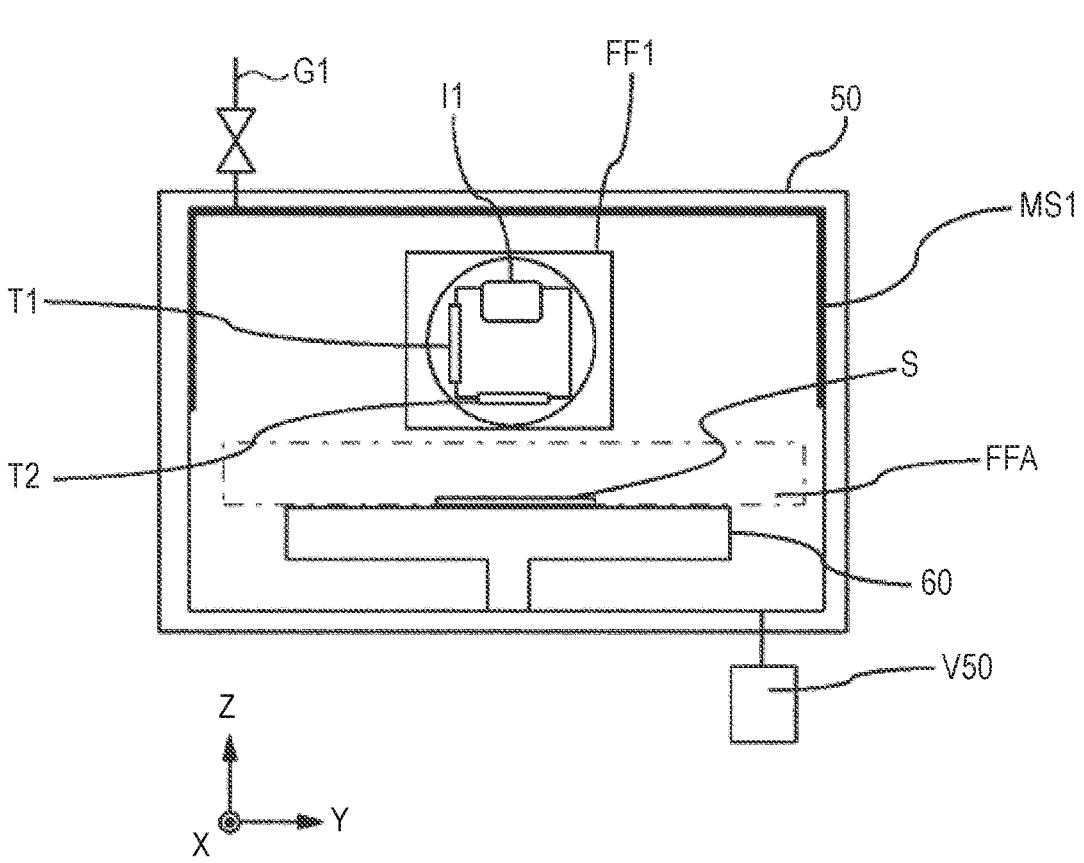
FIG. 1 is a cross-sectional view of a film forming apparatus according to a first embodiment of the present invention, which is cut along a vertical plane.

FIG. 1 is a cross-sectional view of a film forming apparatus according to a first embodiment of the present invention cut along a vertical plane. Here, the XY plane is a plane parallel to the horizontal plane, and the Z axis is an axis parallel to the vertical direction.

The first major feature of the film forming apparatus of the present invention is that a preventing plate MS1 formed of a material having a large getter effect on gas or water ($H_2O$) remaining in the process chamber 50 is provided on surface of the inner wall of the process chamber 50, and functions as a getter material supply source MS1. The material having a large getter effect is, for example, titanium (Ti), and is preferably a material of an adhesive film. The adhesive film is preferably a film that serves as a base for a wiring connected to an electronic component on a substrate, and is preferably a Ti film, a TiN film, a Ta film, a TaN film, an Ni film, a Cr film, an NiCr alloy film, a Ta alloy film, and a Cu alloy film.

It is desirable that the preventing plate MS1 is provided on the upper surface of the inner wall of the process chamber 50 facing the substrate S. The preventing plate MS1 may be provided on both sides of the inner wall of the process chamber 50 not facing the substrate S.

As shown in FIG. 1, the film forming apparatus comprises the process chamber 50, a processing device FF1 provided in the process chamber 50 forming an adhesive film as a base for wiring connected to electronic components on the substrate S, an exhaust device V50 capable of evacuating the inside of the process chamber 50, a gas introduction device G1 for introducing gas for forming the adhesive film into the process chamber 50, a holder 60 for holding the substrate S in the process chamber 50, a driving device (not shown) for driving the holder 60 holding the substrate S so that the substrate S passes through a film forming area in the process chamber 50, a cooling device (not shown) for cooling the holder 60, and a control apparatus (not shown) for controlling the exhaust device V50 and the gas introduction device G1. The details of the control apparatus will be described with reference to FIG. 2, which will be described later.

The control apparatus includes a storage device for storing a control program. The processing device FF1 includes a plurality of targets (T1 and T2) and a rotating cathode for rotating a support for holding an ion gun I1.

The target T1 is a material having a large getter effect on gas or water ($H_2O$) remaining in the process chamber 50, for example, titanium (Ti), and is preferably a material of an adhesive film (a Ti film, a TiN film, a Ta film, a TaN film, an Ni film, a Cr film, an NiCr alloy film, a Ta alloy film, a Cu alloy film) formed on the substrate S.

The target T2 is, for example, copper (Cu), and is preferably a material of a seed film formed on the adhesive film. The seed film is preferably a film for forming a wiring formed on the adhesive film, and is preferably a Cu film, a CuAl alloy film, or a CuW alloy film.

As described above, the preventing plate having a large getter effect on gas or water ($H_2O$) remaining in the process chamber 50 is provided on the surface of the inner wall of the process chamber 50, and functions as a getter material supply source MS.

In this state, when a voltage (not shown) is applied to the ion gun I1 to convert the Ar gas into plasma, for example, the preventing plate MS1 made of Ti is sputtered, and a Ti film can be formed on the inner wall of the process chamber 50 of the film forming area FFA (the side facing the substrate S) and the magnetic pole of the ion gun I1.

The target T1 made of Ti may be used instead of the ion gun I1. In this case, the target T1 is directed to a side other than the film forming area FFA (a side not facing the substrate S). When a voltage is applied to the target T1 in this state to convert the Ar gas into plasma, the Ti film is formed on the preventing plate MS1, and a material having a large getter effect on the gas or water ($H_2O$) remaining in the process chamber 50 can be formed on the inner wall of the process chamber 50 other than the film forming area FFA (the side not facing the substrate S).

Figure 2:
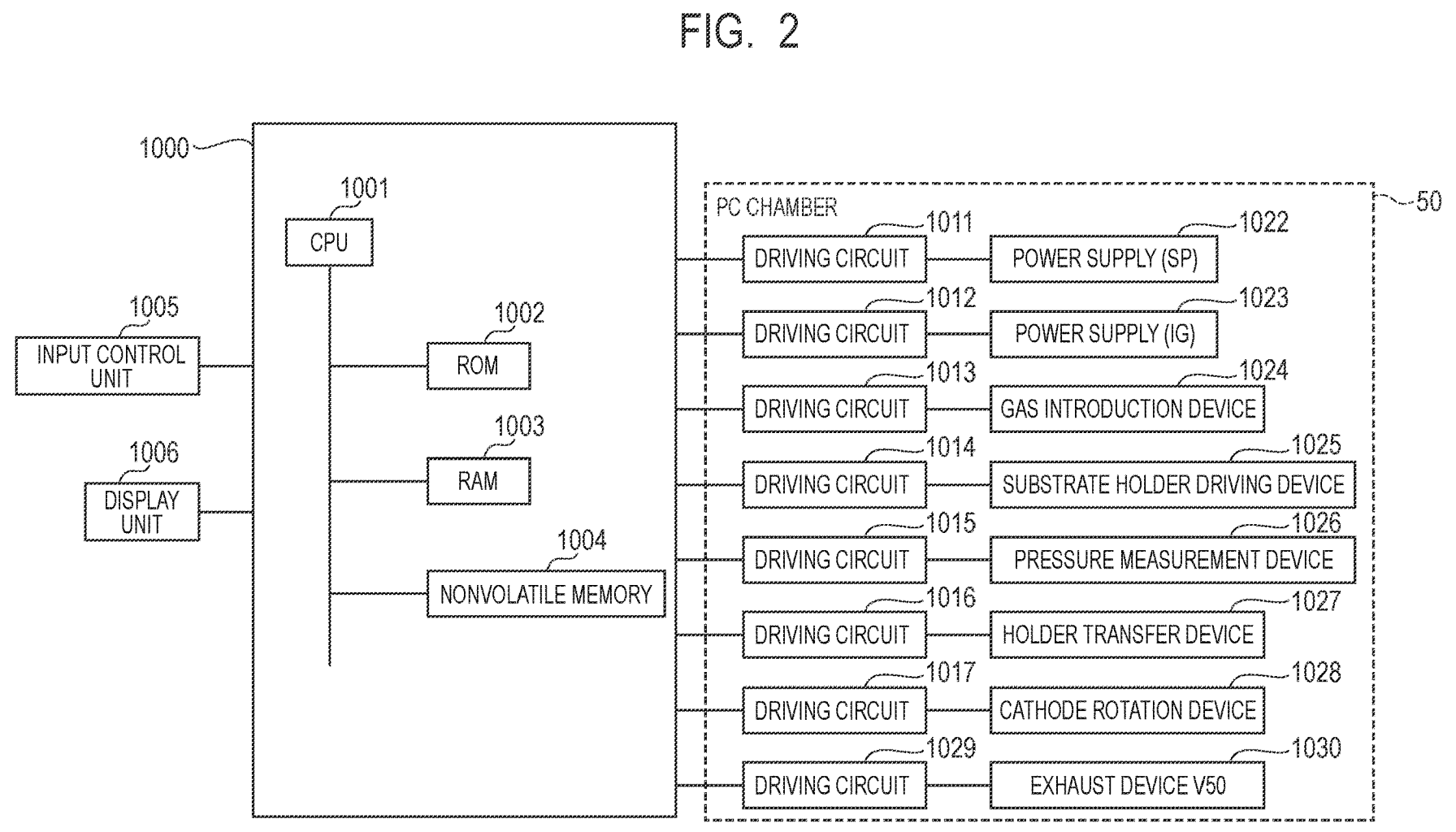

FIG. 2 is a block diagram schematically showing a control system of the process chamber 50 in the film forming apparatus 1 according to the first embodiment of the present invention.

In FIG. 2, the control apparatus 1000 is a control unit as a control means for controlling the process chamber 50 of the film forming apparatus 1. The control apparatus 1000 includes a CPU 1001 for executing various processing operations such as calculation, control, and determination, and a ROM 1002 (also referred to as a "storage unit") for storing control programs such as processing to be described later with reference to FIGS. 3 to 9 executed by the CPU 1001. The control apparatus 1000 also includes a RAM 1003 for temporarily storing data during the processing operation of the CPU 1001, input data, and the like, and a nonvolatile memory 1004. The control apparatus 1000 is connected to an input control unit 1005 including a keyboard or various switches for inputting predetermined commands or data, and a display unit 1006 for performing various displays including the input/setting state of the film forming apparatus 1. Further, a power supply (SP) 1022 for a sputtering cathode in the process chamber 50, a power supply (IG) 1023 for an ion gun, a gas introduction device 1024, a substrate holder driving device 1025, a pressure measurement device 1026, a holder transfer device 1027, a cathode rotation device 1028, and exhaust device V50: 1030 are connected to the control apparatus 1000 via driving circuits 1011 to 1017, 1029, respectively.

Example 1-1

Figure 3:
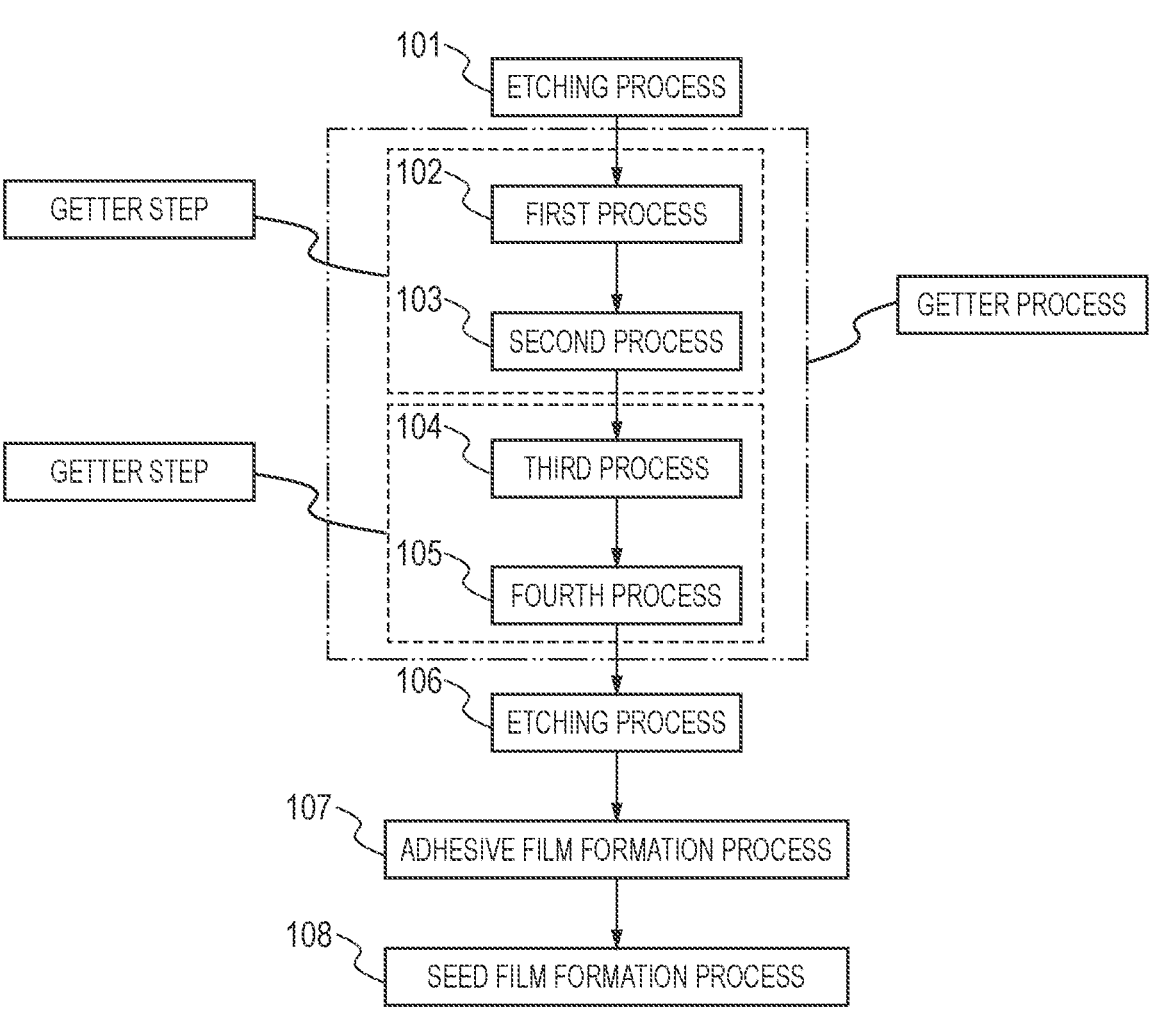
FIG. 3 is a diagram showing the flow of the film forming method of example 1-1, example 1-2, and example 1-3 of the first embodiment of the present invention.

FIG. 3 is a diagram showing the flow of the film forming method of example 1-1, example 1-2, and example 1-3 of the first embodiment of the present invention. A major feature of the film forming method of the present invention is that a first process (step 102) of forming, in the process chamber 50, a material having a large getter effect on gas or water ($H_2O$) remaining in the process chamber 50 and a second process (step 103) of exhausting the process chamber 50 for a predetermined period of time after the first process (step 102) are carried out at least twice before the adhesive film forming step of forming the adhesive film on the substrate S provided in the process chamber 50 shown in FIG. 1. As shown in FIG. 3, the film forming method includes a first process (step 102) of forming, in a process chamber 50, a material having a large getter effect on gas or water ($H_2O$)

remaining in the process chamber 50, a second process (step 103) of exhausting the process chamber 50 for a predetermined period of time after the first process (step 102), a third process (step 104) of forming, in the process chamber 50, a material having a large getter effect on gas or water ($H_2O$) remaining in the process chamber 50 after the second process (step 103), a fourth process (step 105) of exhausting the process chamber 50 for a predetermined period of time after the third process (step 104), and an adhesive film forming step (step 107) of forming adhesive films on the substrate S provided in the process chamber 50 after the fourth process (step 105). Hereinafter, in the present specification, the term of "getter step" refers to "a first process (step 102) of forming a material having a large getter effect on gas or water ($H_2O$) remaining in the process chamber 50" and "a second process (step 103) of exhausting the process chamber 50 for a predetermined period of time after the first process (step 102)" or "a third process (step 104) of forming, in the process chamber, the material having a large getter effect on gas or water ($H_2O$) remaining in the process chamber 50" and "a fourth process (step 105) of exhausting the process chamber 50 for a predetermined time in the third process (step 104)," as shown in FIG. 3.

The term of "getter process" refers to a process of performing the getter step at least twice. The term of "getter process" refers to "steps 102 to 105" shown in FIG. 3. Accordingly, in the present specification, performing (steps 102 and 103) or (steps 104 and 105) shown in FIG. 3 after step 104 shown in FIG. 3 is also referred to as a "getter process".

As shown in FIG. 3, an etching step (step 101) for etching the surface of the substrate S may be included before the first process of step 102, an etching step (step 106) for etching the surface of the substrate S may be included after the fourth process of step 105, and etching steps (steps 101 and 106) for etching the surface of the substrate S may be included before the first process of step 102 and after the fourth process of step 105.

As shown in FIG. 3, a seed film forming step (step 108) in which a seed film for forming wiring is formed on the adhesive film may be included after the adhesive film forming step (step 107).

The substrate S in step 101 or 102 is preferably a Si substrate or a resin film fixed to rectangular members or supports made of glass or resin.

The adhesive film in step 107 is preferably a Ti film, a TiN film, a Ta film, a TaN film, an Ni film, a Cr film, an NiCr alloy film, a Ta alloy film, or a Cu alloy film.

The seed film in step 108 is preferably a Cu film, a CuAl alloy film, or a CuW alloy film.

When the etching step of step 101 or step 106 is performed, the holder for holding the plurality of targets and the ion guns is rotated to direct the ion gun I1 to the film forming area FFA (substrate S side). After the pressure in the process chamber 50 is stabilized, a voltage is applied to the ion gun I1 from the gas introduction device G1 to convert the Ar gas into plasma. Then, the substrate S is etched. When the etching step of step 101 or step 106 is completed, the application of voltage to the ion gun I1 is stopped.

When the first process of step 102 or the third process of step 104 is performed, the holder for holding the plurality of targets and the ion guns is rotated to direct the ion gun I1 to a side other than the film forming area FFA (a side not facing the substrate S). On the inner wall of the process chamber 50 other than the film forming area FFA, the preventing plate MS1 is installed as the getter material supply source MS1. When a voltage is applied to the ion gun I1 in this state to convert Ar gas into plasma, the preventing plate MS1 is sputtered, and a material having a large getter effect on gas or water ($H_2O$) remaining on the inner wall of the process chamber 50 of the film forming area FFA (the side facing the substrate S) can be formed.

When the adhesive film forming step is performed in step 107, the holder for holding the plurality of targets and the ion guns is rotated to direct the target T1 to the film forming area FFA (substrate S side). After the pressure of the process chamber 50 is stabilized, a preset electric power is supplied to the target T1 to convert the Ar gas into plasma. Then, an adhesive film is formed on the substrate S.

When the seed film forming step is performed in step 108, a holder for holding the plurality of targets and the ion guns is rotated to direct the target T2 to the film forming area FFA (substrate S side). After the pressure of the process chamber 50 is stabilized, a preset electric power is supplied to the target T2 to convert the Ar gas into plasma. Then, a seed film is formed on the adhesive film.

Example 1-2

The steps other than the first process of step 102 and the third process of step 104 are the same as those of example 1-1.

The first process of step 102 or the third process of step 104 can also be performed on the target T1. In this case, the holder for holding the plurality of targets and ion guns is rotated to direct the target T1 to a side other than the film forming area FFA (a side not facing the substrate S). After the pressure of the process chamber 50 is stabilized, a preset electric power is supplied to the target T1 to convert the Ar gas into plasma. Then, a material having a large getter effect on gas or water ($H_2O$) remaining on the inner wall of the process chamber 50 other than the film forming area FFA can be formed.

Example 1-3

The steps other than the first process of step 102 and the third process of step 104 are the same as those of example 1-1.

In the first process of step 102 or the third process of step 104, the above-described method using the ion gun I1 and the method using the target T1 may be used in combination. A material having a large getter effect can be formed to the gas or water ($H_2O$) remaining on the inner wall of the process chamber 50 in the film forming area FFA (the side facing the substrate S) and on the inner wall of the process chamber 50 in the film forming area FFA (the side facing the substrate S).

A control program is stored in a ROM 1002 (also referred to as a "storage unit") of the control apparatus shown in FIG. 2. The control program will be described using the film forming apparatus shown in FIG. 1, the control apparatus shown in FIG. 2, and the film forming method shown in FIG. 3.

The control program comprises a first process (step 102) of forming, in the process chamber 50, a material having a large getter effect on gas or water ($H_2O$) remaining in the process chamber, a second process (step 103) of exhausting the process chamber for a predetermined period of time after the first process (step 102), a third process (step 104) of forming, in the process chamber 50, a material having a large getter effect on gas or water ($H_2O$) remaining in the process chamber 50 after the second process (step 103), a fourth process (step 105) of exhausting the process chamber

50 for a predetermined period of time after the third process (step 104), and an adhesive film forming step of forming adhesive films on the substrates S provided in the process chamber 50 after the fourth process (step 105), wherein the exhaust device V50 and the gas introduction device G1 are controlled so that duty cycle D=P1/P becomes 34% or more and 66% or less, when P1 is a time of the first process (step 102) or the third process (step 104) and P is a total time of the first process (step 102) and the second process (step 103) or a total time of the third process (step 104) and the fourth process (step 105).

A specific operation example (example 1-1, example 1-2, and example 1-3) of the film forming apparatus of the first embodiment will be described below with reference to FIGS. 4 to 8.

Example 1-1

Figure 4:
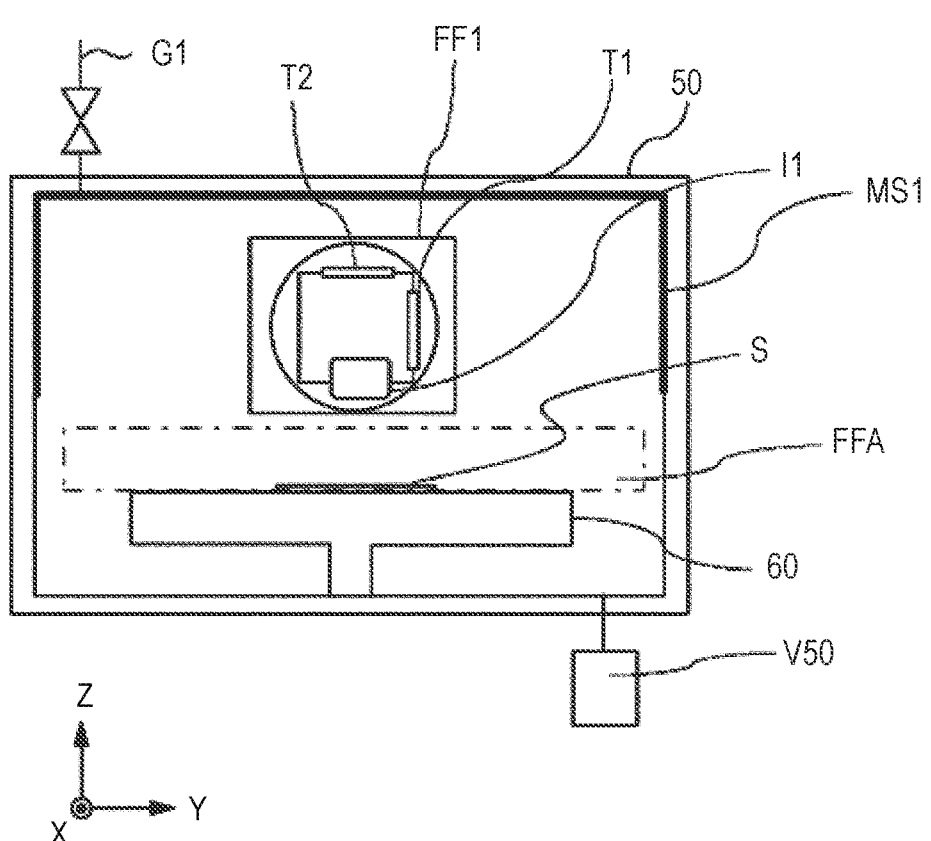
FIG. 4 is a diagram showing a specific operation example of a film formation procedure of example 1-1, example 1-2, and example 1-3 of the first embodiment of the present invention.

First, as shown schematically in FIG. 4, in order to form a film on the surface of the substrate S, the substrate S is conveyed into the process chamber 50 by a conveyance device (not shown), and the substrate S is held in the holder 60.

Next, as shown schematically in FIG. 4 (corresponding to step 101 in FIG. 3), the holder for holding the plurality of targets and the ion guns is rotated to direct the ion gun I1 to the film forming area FFA (the side facing the substrate S). After the pressure in the process chamber 50 is stabilized from the gas introduction device G1, a voltage is applied to the ion gun I1 to convert the Ar gas into plasma. Then, the substrate S is etched. Thereby, the surface of the substrate S is planarized, roughened, cleaned and/or activated, for example. When the etching process is completed, the application of voltage to the ion gun I1 is stopped.

Figure 5:
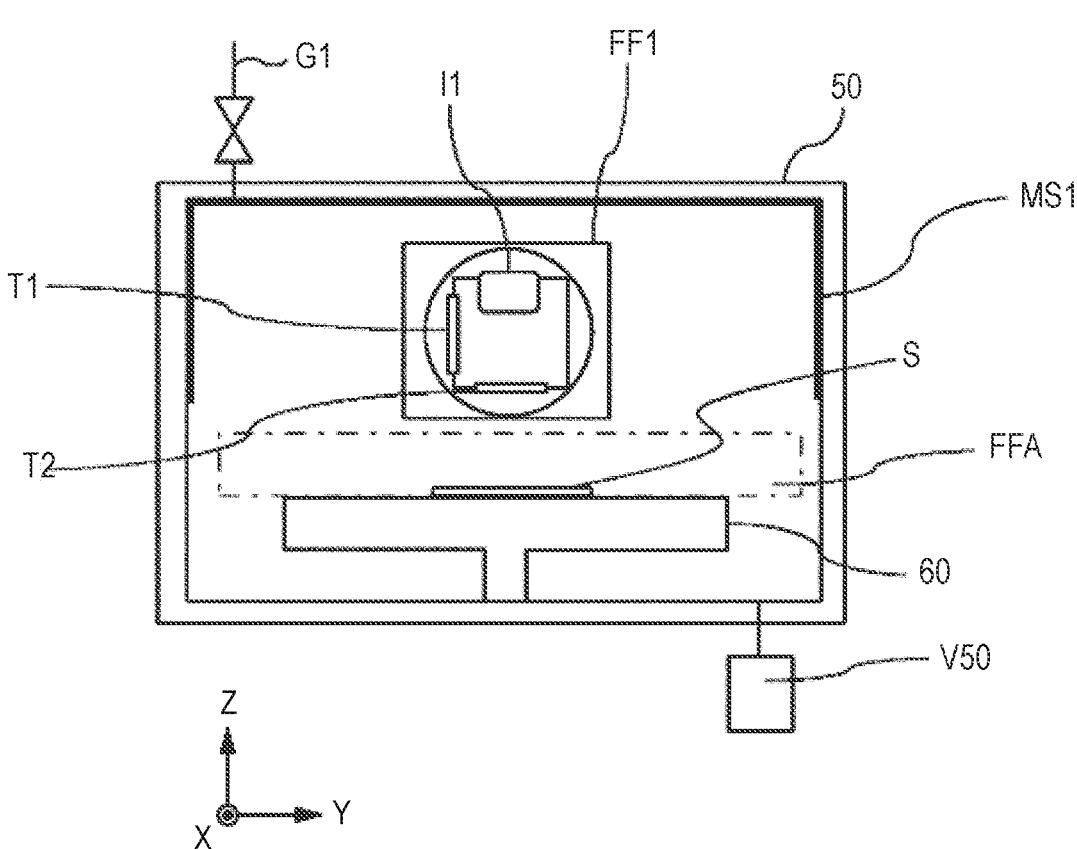
FIG. 5 is a diagram showing a specific operation example of a film formation procedure of example 1-1, example 1-2, and example 1-3 of the first embodiment of the present invention.

Next, as shown schematically in FIG. 5 (corresponding to step 102 in FIG. 3), the holder for holding the plurality of targets and the ion guns is rotated to direct the ion gun I1 to a side other than the film forming area FFA (a side not facing the substrate S). After the pressure in the process chamber 50 is stabilized from the gas introduction device G1, a voltage is applied to the ion gun I1 to convert the Ar gas into plasma. On the inner wall of the process chamber 50 other than the film forming area FFA, the preventing plate MS1 is installed as the getter material supply source MS1. When a voltage is applied to the ion gun I1 in this state to convert Ar gas into plasma, the preventing plate MS1 is sputtered, and a material having a large getter effect on gas or water ($H_2O$) remaining on the inner wall of the process chamber 50 of the film forming area FFA (the side facing the substrate S) can be formed.

It is preferable that the Ar gas supplied to the process chamber 50 is started to be supplied into the process chamber 50 at the same time as the start of the first process (step 102 in FIG. 3) by using the gas introduction device G1, and is stopped from being supplied into the process chamber at the same time as the end of the first process.

It is preferable that the exhaust device V50 is used to start the exhaust in the process chamber 50 before or at the same time as the start of the first process (step 102 in FIG. 3).

It is preferable that the power supplied to the process chamber 50 is started to be supplied into the process chamber at the same time as the start of the first process by using the power supply (SP) or the power supply (IG) shown in FIG. 2, and is stopped at the same time as the end of the first process.

After a material having a large getter effect is formed on the surface of the inner wall of the process chamber 50, the process chamber 50 is exhausted for a predetermined period of time using the exhaust device V50 in a state where the supply of Ar gas from the gas introduction device G1 into the process chamber 50 is stopped (corresponding to step 103 in FIG. 3).

As a result, the first getter step (corresponding to steps 102 and 103 in FIG. 3) ends.

When the second getter step (step 104 and step 105 in the third process and the fourth process, respectively, in FIG. 3) is started, as shown schematically in FIG. 5 (corresponding to step 104 in FIG. 3), after the pressure in the process chamber 50 is stabilized from the gas introduction device G1, a voltage is applied to the ion gun I1 to convert the Ar gas into plasma. On the inner wall of the process chamber 50 other than the film forming area FFA, the preventing plate MS1 is installed as the getter material supply source MS1. When a voltage is applied to the ion gun I1 in this state to convert Ar gas into plasma, the preventing plate MS1 is sputtered, and a material having a large getter effect on gas or water ($H_2O$) remaining on the inner wall of the process chamber 50 of the film forming area FFA (the side facing the substrate S) can be formed.

It is preferable that the Ar gas supplied to the process chamber 50 is started to be supplied into the process chamber 50 at the same time as the start of the third process (step 104 in FIG. 3) by using the gas introduction device G1, and is stopped from being supplied into the process chamber at the same time as the end of the third process.

It is preferable that the power supplied to the process chamber 50 is started to be supplied into the process chamber at the same time as the start of the third process by using the power supply (SP) or the power supply (IG) shown in FIG. 2, and is stopped at the same time as the end of the third process.

After the material having a large getter effect is formed on the surface of the inner wall of the process chamber 50, the process chamber 50 is exhausted for a predetermined period of time using the exhaust device V50 in a state where the supply of Ar gas from the gas introduction device G1 into the process chamber 50 is stopped (corresponding to step 105 in FIG. 3).

As a result, the second getter step (corresponding to steps 104 and 105 in FIG. 3) ends, and the "getter process" in FIG. 3 ends.

Figure 7:
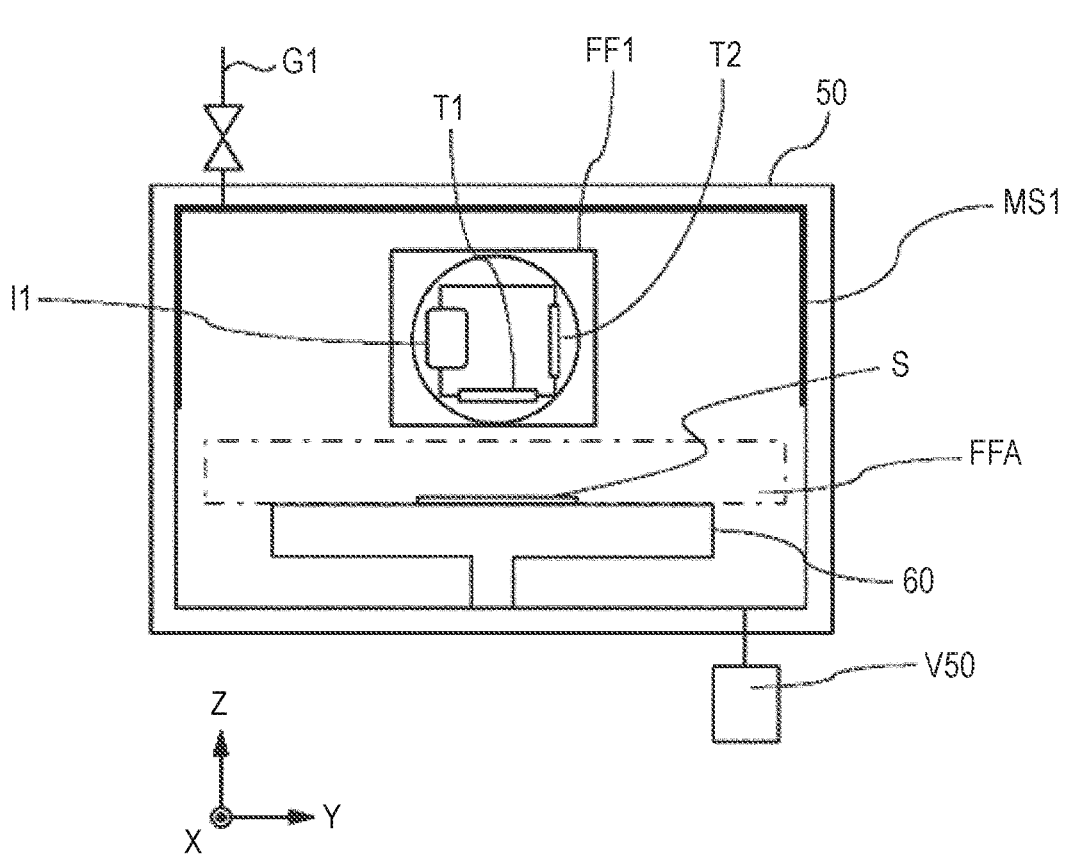
FIG. 7 is a diagram showing a specific operation example of a film formation procedure of example 1-1, example 1-2, and example 1-3 of the first embodiment of the present invention.

Next, as shown schematically in FIG. 7 (corresponding to step 107 in FIG. 3), the holder for holding the plurality of targets and the ion guns is rotated to direct the target T1 to the film forming area (the side facing the substrate S). After the pressure of the process chamber 50 is stabilized, a preset electric power is supplied to the target T1 to convert the Ar gas into plasma. The adhesive film can be formed on the substrate S.

Figure 8:
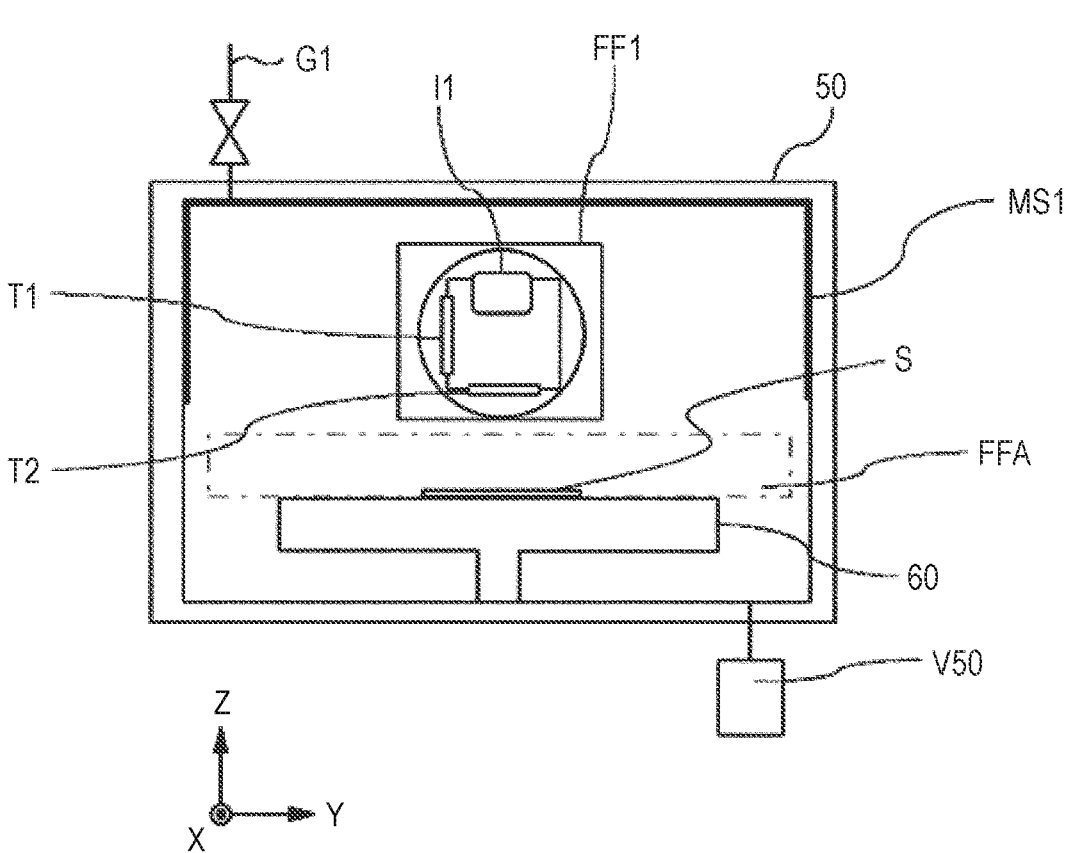
FIG. 8 is a diagram showing a specific operation example of a film formation procedure of example 1-1, example 1-2, and example 1-3 of the first embodiment of the present invention.

Next, as shown schematically in FIG. 8 (corresponding to step 108 in FIG. 3), the holder for holding the plurality of targets and the ion guns is rotated to direct the target T2 toward the film forming area (the side facing the substrate S). After the pressure of the process chamber 50 is stabilized, a preset electric power is supplied to the target T2 to convert the Ar gas into plasma. Then, a seed film can be formed on the substrate S.

Example 1-2

The first process of the step 102 or the third process of the step 104 shown in FIG. 3 can also be performed on the target T1. In this case, as shown schematically in FIG. 6 (corresponding to step 102 or step 104 in FIG. 3), the holder for holding the plurality of targets and the ion guns is rotated to direct the target T1 to a side other than the film forming area FFA (a side not facing the substrate S). After the pressure of the process chamber 50 is stabilized, a preset electric power is supplied to the target T1 to convert the Ar gas into plasma. Then, a material having a large getter effect on gas or water ($H_2O$) remaining on the inner wall of the process chamber 50 other than the film forming area FFA can be formed.

Example 1-3

In the first process of the step 102 or the third process of the step 104 shown in FIG. 3, the above-described method using the ion gun I1 and the method using the target T1 may be used in combination. In this case, as shown in FIG. 5, the ion gun I1 is directed to a side other than the film forming area FFA (a side not facing the substrate S). At this time, the target T1 is positioned opposite to the side wall of the inner wall of the process chamber 50. In this state, after the pressure in the process chamber 50 is stabilized, a voltage is applied to the ion gun I1, and a preset electric power is supplied to the target T1 to convert the Ar gas into plasma. A material having a large getter effect can be formed to the gas or water ($H_2O$) remaining on the side wall of the inner wall of the process chamber 50 of the film forming area FFA (the side facing the substrate S) and the inner wall of the process chamber 50 of the film forming area FFA (the side facing the substrate S).

Figure 6:
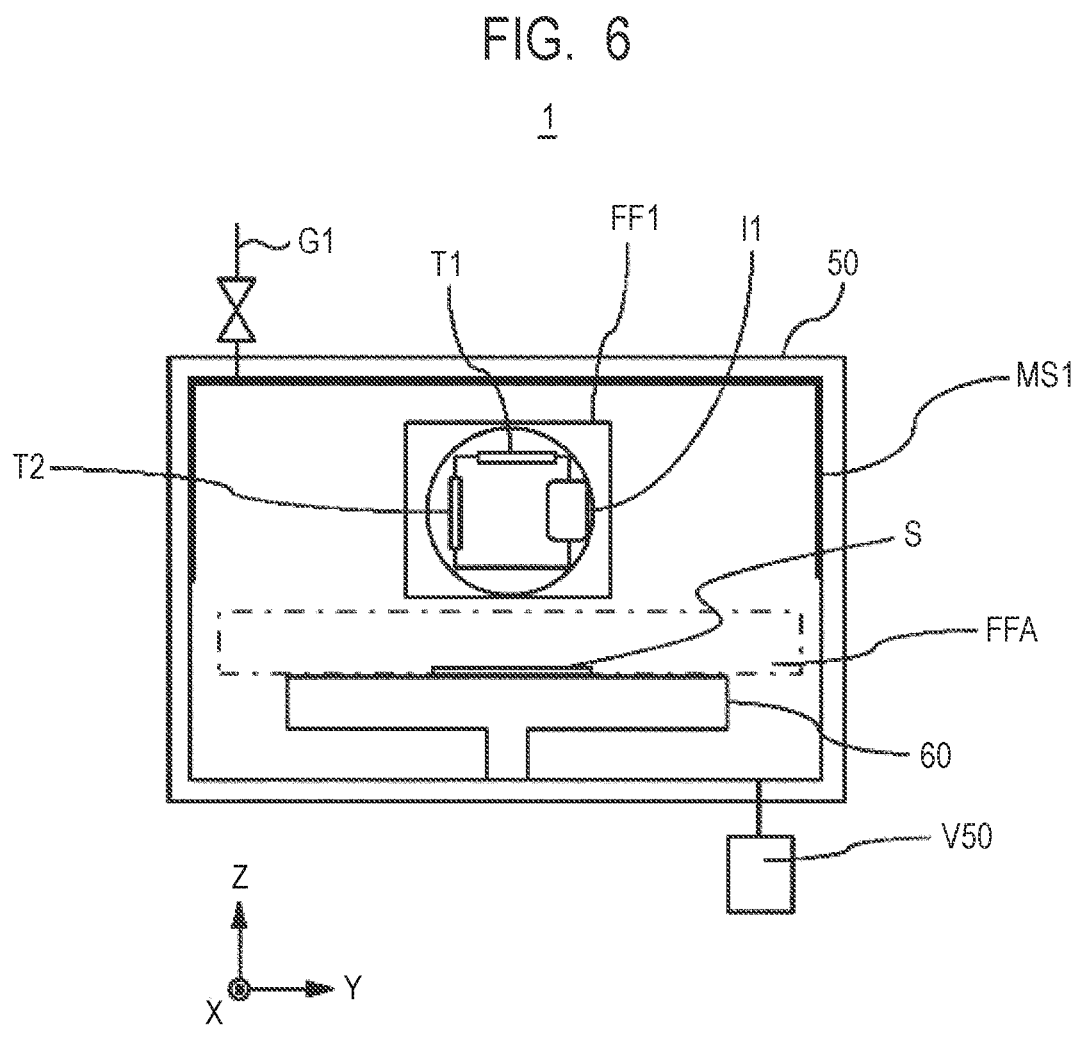

The method using the ion gun I1 and the method using the target T1 can be used in combination even in the case of FIG. 6. In this case, as shown schematically in FIG. 6 (corresponding to step 102 or step 104 in FIG. 3), the holder for holding the plurality of targets and the ion guns is rotated to direct the target T1 to a side other than the film forming area FFA (a side not facing the substrate S). In this case, the ion gun I1 is positioned opposite to the side wall of the inner wall of the process chamber 50. In this state, after the pressure in the process chamber 50 is stabilized, a voltage is applied to the ion gun I1, and a preset electric power is supplied to the target T1 to convert the Ar gas into plasma. A material having a large getter effect can be formed to the gas or water ($H_2O$) remaining on the side wall of the inner wall of the process chamber 50 of the film forming area FFA (the side facing the substrate S) and the inner wall of the process chamber 50 of the film forming area FFA (the side facing the substrate S).

Further, the method using the ion gun I1 and the method using the target T1 can be used in combination with the case of FIG. 5 and the case of FIG. 6.

In this case, as shown in FIG. 5, the ion gun I1 is directed to a side other than the film forming area FFA (a side not facing the substrate S). In this state, after the pressure in the process chamber 50 is stabilized, a voltage is applied to the ion gun I1 to convert the Ar gas into plasma. A material having a large getter effect is formed to the gas or water ($H_2O$) remaining on the side wall of the inner wall of the process chamber 50 of the film forming area FFA (the side facing the substrate S) and the inner wall of the process chamber 50 of the film forming area FFA (the side facing the substrate S).

At this time, the preventing plate MS1 formed on the upper inner wall of the process chamber 50 is sputtered by the ion gun I1.

In this state, as shown in FIG. 6, when the holder for holding the plurality of targets and the ion guns is rotated to direct the target T1 to the side other than the film forming area FFA (the side not opposed to the substrate S), the target T1 faces the upper inner wall of the process chamber 50. After the pressure of the process chamber 50 is stabilized, a preset electric power is supplied to the target T1 to convert the Ar gas into plasma. Thereby, the material having a large getter effect can be formed on the preventing plate MS1 formed on the upper inner wall of the process chamber 50 sputtered by the ion gun I1.

Second Embodiment

Hereinafter, a film forming apparatus, a control apparatus for the film forming apparatus, and a film forming method according to a second embodiment of the present invention will be described through examples 1-1 to 3-3 with reference to the accompanying drawings.

Figure 9:
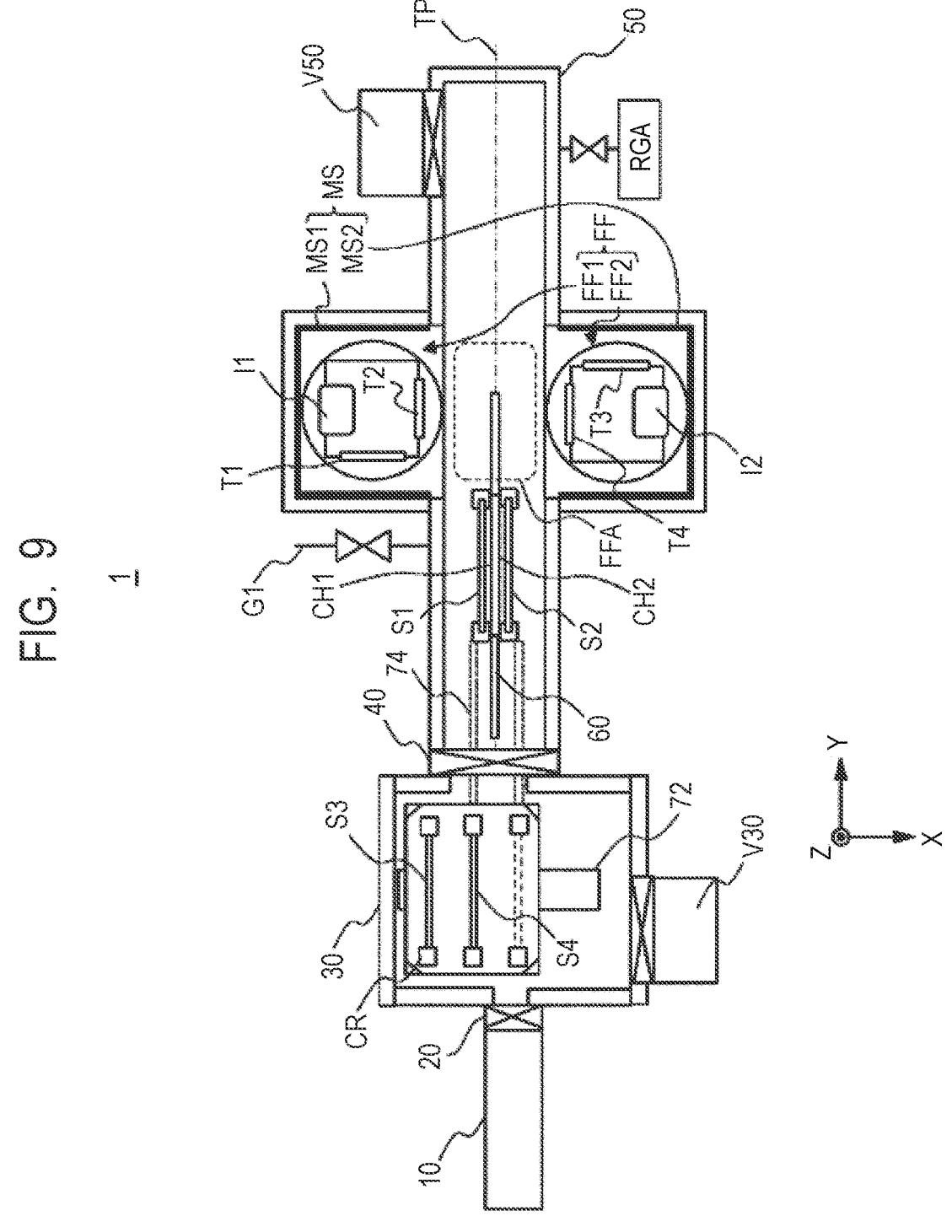
FIG. 9 is a schematic cross-sectional view of a film forming apparatus according to a second embodiment of the present invention, which is cut on a plane parallel to a horizontal plane.

FIG. 9 is a schematic cross-sectional view of a film forming apparatus according to an embodiment of the present invention, which is cut on a plane parallel to a horizontal plane. The film forming apparatus 1 of FIG. 9 comprises a process chamber 50, a platform 10 that can be used to deliver a substrate S between other apparatuses other than the film forming apparatus, and a load lock chamber 30 that can be used to deliver an untreated substrate S provided from the platform 10 and a substrate S after film forming provided from the process chamber 50.

The basic configuration of the process chamber 50 of the second embodiment is the same as the basic configuration of the process chamber of the first embodiment, but is different from the basic configuration of the process chamber of the first embodiment in that the processing device FF comprises the first processing device FF1 and the second processing device FF2.

The first major feature of the film forming apparatus shown in FIG. 9 is that the surface of the inner wall of the process chamber 50 is provided with the preventing plate of a material (for example, a Ti film) having a large getter effect on gas or water (H$_2$O) remaining in the process chamber 50, and functions as a getter material supply source MS. The getter material supply source MS is different from the getter material supply source MS1 of the first embodiment in that it comprises a first getter material supply source MS1 of the first processing device FF1 and a second getter material supply source MS2 of the second processing device FF2.

Here, the XY plane is a plane parallel to the horizontal plane, and the Z axis is an axis parallel to the vertical direction. The film forming apparatus is configured as an apparatus for forming a film on a substrate S. The substrate S can be transferred and processed while being held by the carrier CR, for example.

The film forming apparatus of the present embodiment is a plasma processing apparatus capable of performing a plurality of types of processing in one processing chamber. Since a plasma processing apparatus capable of performing a plurality of types of processing in one processing chamber does not require a processing chamber different from each processing chamber, the occupied area of the apparatus as a whole can be reduced, which is advantageous in saving the space of the apparatus. In the present embodiment, the switching of the processing is realized by rotating the support holding the plurality of targets and the ion guns.

The film forming apparatus has a platform 10 and a load lock chamber 30 provided with a heating device in addition to the process chamber 50 for performing a process for forming a film on a substrate S. The platform 10 is used to deliver substrate S to and from other devices. The load lock chamber 30 is provided with an exhaust device V30 capable of evacuating the inside of the load lock chamber 30, and the process chamber 50 is provided with an exhaust device V50 capable of evacuating the inside of the process chamber 50. The exhaust device V30 and the exhaust device V50 are vacuum pumps such as a dry pump and a turbomolecular pump. A gate valve 20 is provided between the platform 10 and the load lock chamber 30, and a gate valve 40 is provided between the load lock chamber 30 and the process chamber 50. The substrate S is carried while being held by the carrier CR. A conveying device conveying the carrier CR is incorporated in the load lock chamber 30 and the process chamber 50.

The transfer device of the load lock chamber 30 is provided with a carrier CR provided with an untreated substrate S provided from the platform 10 and a device for operating the carrier CR provided with the substrate S after the film provided from the process chamber 50 is formed. The operation device 72 drives, for example, a container capable of holding a plurality of substrates S along the X-axis. The substrate S is conveyed between the platform 10 and the load lock chamber 30 by a conveying device (not shown). The carrier CR is conveyed between the load lock chamber 30 and the process chamber 50 by the transfer device 74.

The conveying device of the process chamber 50 is provided with a transfer device for transferring the carrier CR conveyed from the load lock chamber 30 to a holder 60 in the process chamber 50, and a holder 60 for holding the carrier CR in the process chamber 50. The holder 60 has a first chuck CH1 and a second chuck CH2 arranged on mutually opposite sides. The first chuck CH1 and the second chuck CH2 may include, for example, an electrostatic chuck or a mechanical chuck. The film forming apparatus shown in FIG. 9 includes a driving device for moving the holder 60 holding the carrier CR along the moving path TP so that the substrate S passes through the film forming area FFA in the process chamber 50. The driving device may employ, for example, a linear motor or a ball screw mechanism. The moving path TP is, for example, parallel to the surface of the substrate S to be processed.

The substrate S may be, for example, a Si substrate or a resin film fixed to rectangular members or supports made of a glass or resin. As the resin-made rectangular member, for example, a glass epoxy substrate and a build-up substrate can be used. As the resin film, for example, a polyimide film can be used. The substrate S may be a laminate of a polyimide resin, an epoxy resin, a phenol resin or a poly-benzoxazole resin as an interlayer insulating film. Here, a wiring layer may be formed on the substrate S as a laminate with the resin, or the laminate may be a laminate in which the resin is applied on the substrate without forming the wiring. However, the shape and material of the substrate S are not limited to a specific one.

The film forming apparatus shown in FIG. 9 may include a processing device FF which performs a step of forming a material (for example, a Ti film) having a large getter effect on gas or water (H$_2$O) remaining on the inner wall of the chamber, and a step of etching and forming a film on a substrate S passing through the film forming area FFA, with the plasma source directed to an area other than the film forming area FFA. Here, the film forming area FFA is an area in which an etching process is performed and a film is formed on the substrate S.

During a step of forming the material (for example, a Ti film) to gas or water (H$_2$O) remaining on the inner wall of the process chamber 50 other than the film forming area FFA, the processing device FF can be configured so that a material does not adhere to the substrate S. Further, the processing device FF can be configured to perform an etching process and form a film on the substrate S both when the substrate S is moving in the first direction along the moving path TP and when the substrate S is moving in the second direction opposite to the first direction along the moving path TP. The processing device FF may include a first processing device FF1 for forming a film on the first carrier and a second processing device FF2 for forming a film on the second carrier, which are arranged so as to simultaneously form an etching process and a film on the two carriers held by the holder 60 so that the surfaces to be processed of the substrate S face opposite to each other. The film forming area FFA can be provided between the first processing device FF1 and the second processing device FF2. In the first processing device FF1 and the second processing device FF2, a space on the first processing device FF1 side and a space on the second processing device FF2 side are separated by a separation device SP provided in the holder 60 so that the first processing device FF1 and the second processing device FF2 do not face each other when the substrate S is moved, the etching process is performed, and the film is formed.

The processing device FF may also include a getter material supply source MS for forming a material (for example, a Ti film) having a large getter effect on gas or water ($H_2O$) remaining on the inner wall of the chamber other than the film forming area FFA, a plasma generation device for generating plasma for forming the material (for example, a Ti film) on the inner wall of the chamber other than the film forming area FFA, and a plasma generation device for generating plasma for etching and forming a film in the film forming area FFA. For example, although the processing device FF may comprise a rotating cathode for rotating a support holding a plurality of targets and ion guns, this is only an example. The processing device FF may include other configurations.

The first processing device may include a target T1, a target T2, an ion gun I1, and a getter material supply source MS1 for forming a material (for example, a T1 film) having a large getter effect on gas or water ($H_2O$) remaining on the inner wall of the chamber other than the film forming area FFA. For example, the getter material supply source MS1 for forming a material having a large getter effect (for example, a Ti film) on the inner wall of the chamber other than the film forming area FFA may include a Ti film preventing plate, a Ti target, or a film preventing plate other than T1 with a Ti film formed thereon.

Similarly, the second processing device may include a target T3, a target T4, an ion gun I2, and a getter material supply source MS2 for forming a material (for example, a Ti film) having a large getter effect on gas or water ($H_2O$) remaining on the inner wall of the chamber other than the film forming area FFA. For example, the getter material supply source MS2 for forming a material having a large getter effect (for example, a Ti film) on the inner wall of the chamber other than the film forming area FFA may include a T1 preventing plate or a Ti target.

The holder 60 includes a cooling device for cooling the holder 60. When the holder 60 is cooled, the substrate S held by the holder 60 is cooled, and deformation of the substrate S, for example, can be suppressed.

Hereinafter, the processing procedure of the substrate S in the film forming apparatus will be described. In the following description, the substrates S1, S2, S3, and S4 are used to distinguish the substrates S from each other. First, the substrate S1 and the substrate S2 are installed on a first carrier and a second carrier respectively in the platform 10.

The first carrier on which the substrate S1 is installed and the second carrier on which the substrate S2 is installed move to the load lock chamber 30, respectively, and the load lock chamber 30 is evacuated by an exhaust device V30. When the heating processing is performed in the load lock chamber 30, the heating processing of the substrate S is performed by the lamp heater when the pressure of the load lock chamber 30 becomes a predetermined pressure or less. Here, in order to simultaneously perform processing on the substrate S1 provided on the first carrier and the substrate S2 provided on the second carrier, the surfaces to be processed of the substrate S1 provided on the first carrier and the substrate S2 provided on the second carrier have surfaces to be processed facing away from each other, the surface to be processed of the substrate S1 is a surface facing in the +X direction, and the surface to be processed of the substrate S2 is a surface facing in the –X direction.

Then, the operation device 72 of the load lock chamber 30 prepares the carrier to be conveyed to the process chamber 50, and the first carrier is moved to the process chamber 50 and transferred to the holder 60 provided in the process chamber 50. The same operation is performed for the second carrier. Here, the two carriers CR include, in a holder 60 provided in the process chamber 50, the surfaces to be treated of the substrates S installed in the respective carriers CR face opposite to each other, and hold the surfaces to be treated of the substrates S1 face the +X direction and the surfaces to be treated of the substrates S2 face the –X direction. The first carrier and the second carrier move along the moving path TP while being held by the holder 60 in the holder 60 of the process chamber 50 so that the surfaces to be processed face opposite to each other, and pass through the film forming area FFA in the process chamber 50, thereby simultaneously etching and forming a film for the two carriers.

When the first carrier and the second carrier are provided in the process chamber 50, the venting operation of the load lock chamber 30, the installation of the substrate S3 and the substrate S4 to the third carrier and the fourth carrier by the platform 10, the movement of the third carrier and the fourth carrier where the substrate S3 and the substrate S4 are installed to the load lock chamber 30, and the vacuum evacuation of the load lock chamber 30 by the exhaust device V30 are sequentially performed. In a case where the heating treatment is performed in the load lock chamber 30, the heating treatment of the substrate S is performed by the lamp heater when the pressure of the load lock chamber 30 becomes a predetermined pressure or less.

After the first carrier and the second carrier are etched and formed in the process chamber 50, the load lock chamber 30 is prepared for transfer by the operation device 72. After completion of the transfer preparation operation, the first carrier is transferred from the holder 60 provided in the process chamber 50 to the transfer device 74, and the first carrier is moved to the load lock chamber 30. After the first carrier, which has been etched and for which a film has been formed in the process chamber 50, is evacuated to the load lock chamber 30, the operation device 72 of the load lock chamber 30 prepares to transfer the third carrier to the process chamber 50. Thereafter, the third carrier is moved to the process chamber 50. After the third carrier is moved to the process chamber 50, the second carrier is moved to the load lock chamber 30 by the same operation as the first carrier. After the second carrier is moved from the process chamber 50 to the load lock chamber 30, the fourth carrier is moved to the process chamber 50 by the same operation as the second carrier. After the third carrier and the fourth carrier are moved to the process chamber 50, the gate valve 40 is closed. After closing the gate valve 40, the load lock chamber 30 vents the load lock chamber 30, moves the first carrier and the second carrier to the platform 10, and removes the substrate S1 and the substrate S2 from the respective carriers CR. At the same time, in the process chamber 50, the third carrier and the fourth carrier are transferred to the holder 60, and etching and film formation are performed.

When the third carrier and the fourth carrier are provided in the process chamber 50, the venting operation of the load lock chamber 30, the installation of the substrate S5 and the substrate S6 to the first carrier and the second carrier by the platform 10, the movement of the first carrier and the second carrier where the substrate S5 and the substrate S6 are installed to the load lock chamber 30, and the vacuum evacuation of the load lock chamber 30 by the exhaust device V30 are sequentially performed. When the heating treatment is performed in the load lock chamber 30, the heating treatment of the substrate S is performed by the lamp heater when the pressure of the load lock chamber 30 becomes a predetermined pressure or less.

After the third and fourth carriers are etched and formed in the process chamber 50, the load lock chamber 30 is prepared for transfer by the operation device 72. After completion of the transfer preparation operation, the third carrier is transferred from the holder 60 provided in the process chamber 50 to the transfer device 74, and the third carrier is moved to the load lock chamber 30. The same operation is performed for the fourth carrier. After the carrier having been etched and formed in the process chamber 50 is evacuated to the load lock chamber 30, the operation device 72 of the load lock chamber 30 prepares the carrier for moving the first carrier to the process chamber 50. Thereafter, the first carrier is moved to the process chamber 50. The same operation is performed for the second carrier. After closing the gate valve 40, in the load lock chamber 30, the load lock chamber 30 is vented, the third carrier and the fourth carrier are respectively moved to the platform 10, and the substrate S3 and the substrate S4 are removed from the respective carriers. At the same time, in the process chamber 50, the first carrier and the second carrier are transferred to the holder 60, and the substrate S5 mounted on the first carrier and the substrate S6 mounted on the second carrier are etched and a film is formed. By repeating the above operation, continuous processing is performed.

Figure 10:
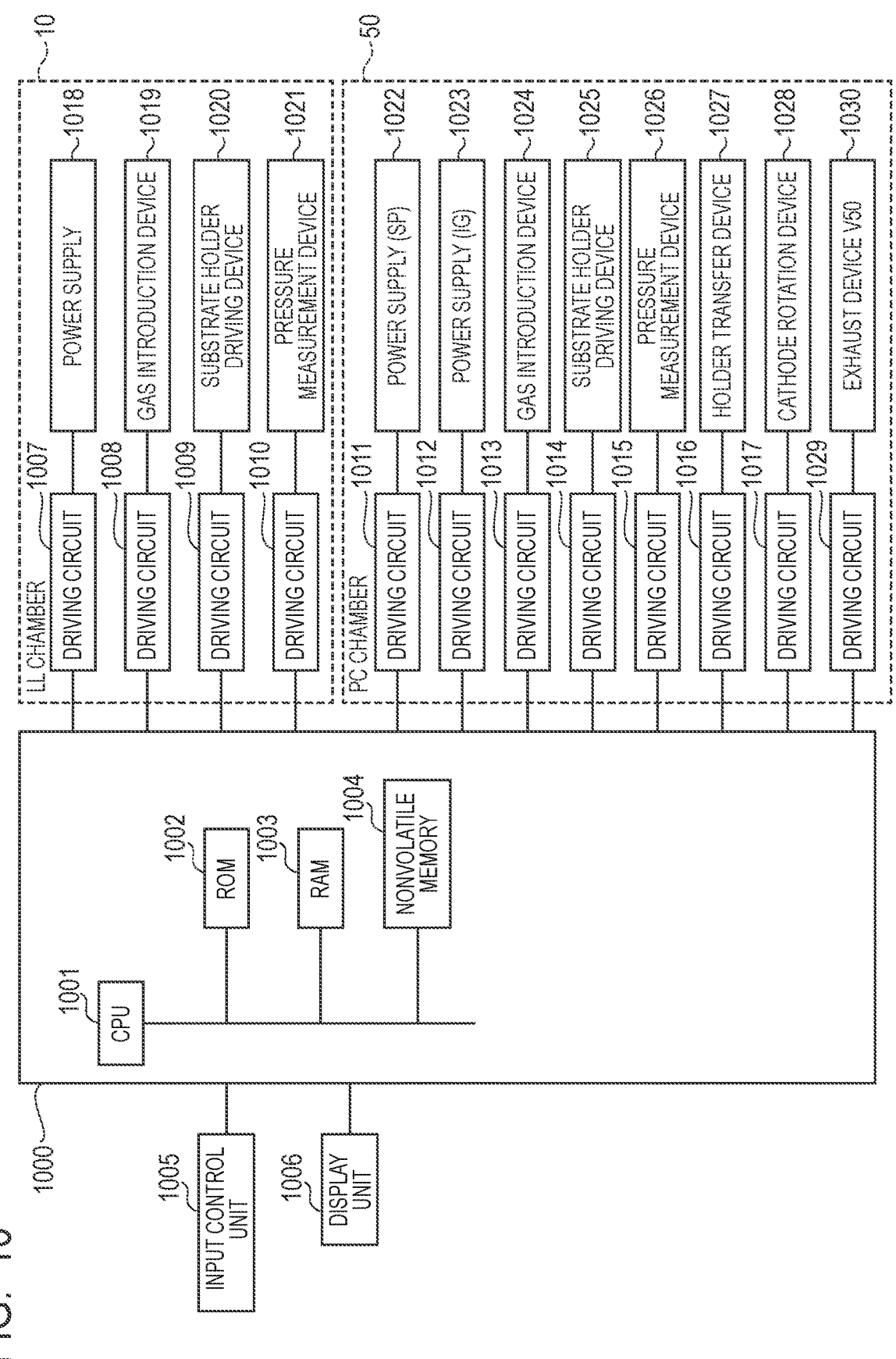
FIG. 10 is a diagram showing a schematic configuration of a control system in a load lock chamber and a process chamber of a film forming apparatus according to a second embodiment of the present invention.

FIG. 10 is a block diagram schematically showing a control system of a load lock chamber and a process chamber in the film forming apparatus 1 according to the second embodiment of the present invention. The control system of example 1-1 of FIG. 11 differs from the control system of FIG. 2 in that the control apparatus 1000 includes a control unit as control means for controlling the load lock chamber 10 of the film forming apparatus 1.

In FIG. 10, the control apparatus 1000 is a controller as a controlling unit for controlling the load lock chamber 10 and the process chamber 50 of the film forming apparatus 1. The control apparatus 1000 includes a CPU 1001 for executing various processing operations such as calculation, control, and determination, and a ROM 1002 (also referred to as a "storage unit") for storing control programs such as processing to be described later in FIGS. 11 to 13 and FIGS. 15 to 16, which are executed by the CPU 1001. The control apparatus 1000 also includes a RAM 1003 for temporarily storing data during the processing operation of the CPU 1001, input data, and the like, and a nonvolatile memory 1004. The control apparatus 1000 is connected to an input control unit 1005 including a keyboard or various switches for inputting a predetermined commands or data, and a display unit 1006 for performing various displays including the input/setting state of the film forming apparatus 1. Further, a power supply 1018 of the load lock chamber 30, a gas introduction device 1019, a substrate holder driving device 1020, a pressure measurement device 1021, a power supply (SP) 1022 for a sputtering cathode of the process chamber 50, a power supply (IG) 1023 for an ion gun, a gas introduction device 1024, a substrate holder driving device 1025, a pressure measurement device 1026, a holder transfer device 1027, a cathode rotation device 1028, exhaust device V50: 1030, and the like are connected to the control apparatus 1000 via driving circuits 1007 to 1017, 1029, respectively.

A control program is stored in a ROM 1002 (also referred to as a "storage unit").

The control program comprises a first process (step 102 in FIG. 2) of forming a material having a large getter effect on gas or water ($H_2O$) remaining in the process chamber 50, a second process (step 103 in FIG. 2) of exhausting the process chamber after the first process (step 102 in FIG. 2) for a predetermined period of time, a third process (step 104 in FIG. 2) of forming a material having a large getter effect on gas or water ($H_2O$) remaining in the process chamber 50 after the second process (step 103 in FIG. 2), a fourth process (step 105 in FIG. 2) of exhausting the process chamber 50 after the third process (step 104 in FIG. 2) for a predetermined period of time, and an adhesive film forming step (step 107 in FIG. 2) of forming adhesive films on the substrate S provided in the process chamber 50 after the fourth process (step 105 in FIG. 2), wherein the exhaust device V50 and the gas introduction device G1 are controlled so that duty cycle D=P1/P becomes 34% or more and 66% or less, when P1 is a time of the first process (step 102 in FIG. 2) or the third process (step 104 in FIG. 2) and P is a total time of the first process (step 102 in FIG. 2) and the second process (step 103 in FIG. 2) or a total time of the third process (step 104 in FIG. 2) and the fourth process (step 105 in FIG. 2).

Example 1-1

Figure 11:
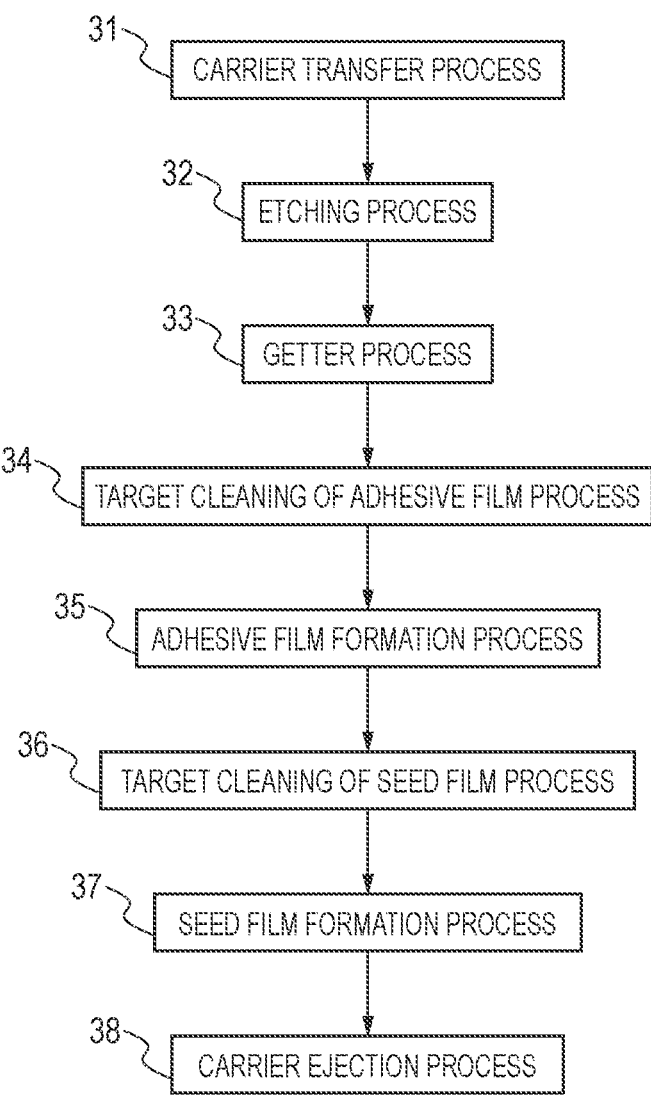
FIG. 11 is a diagram showing the flow of the film forming method of example 1-1, example 1-2, and example 1-3 of the second embodiment of the present invention.

FIG. 11 is a diagram showing the flow of the film forming method of example 1-1, example 1-2, and example 1-3 when the film forming apparatus of the second embodiment is used. Each step will be described below with reference to this flowchart. The basic configuration of the getter process 33 is the same as that of the film forming method in the case of using the film forming apparatus of the first embodiment shown in FIG. 2. That is, the getter process 33 shown in FIG. 11 comprises steps 102 to 105 of the film forming method shown in FIG. 2.

The film forming method of example 1-1 of FIG. 11 differs from the film forming method of FIG. 2 in that a carrier transfer process 31, a target cleaning of an adhesive film process 34, a target cleaning for a seed film process 36, and a carrier ejection process 38 are added.

In step 31, the carrier CR is transferred to the holder 60 in the process chamber 50.

In step 32, an etching process is performed. The holder for holding the plurality of targets and the ion guns is rotated to direct the ion guns I1 and I2 to the film forming area FFA (the side facing the substrate S). After the pressure in the process chamber 50 is stabilized from the gas introduction device G1, a voltage is applied to the ion guns I1 and I2 to convert the Ar gas into plasma. Then, in order to perform the etching process, the carrier is started to be conveyed toward the film forming area FFA, and the substrate S is etched by passing through the film forming area FFA for a specified number of times at a preset conveying speed. When the etching process is completed, voltage application to the ion guns I1 and I2 is stopped. In the present embodiment, an Ar gas is used as the introducing gas, but the present invention is not limited to this, and a reactive gas such as nitrogen, oxygen, or hydrogen can also be used.

In step 33, a getter process is performed. The holder for holding the plurality of targets and ion guns is rotated to direct the ion guns I1 and I2 to a side other than the film forming area FFA (a side not facing the substrate S). On the inner wall of the process chamber 50 other than the film forming area FFA, a preventing plate formed of a material (for example, a Ti film) having a large getter effect on gas or water ($H_2O$) remaining on the inner wall of the chamber 50 is installed as a getter material supply source MS, and when a voltage is applied to the ion guns I1 and I2 in this state to plasma Ar gas, the preventing plate is sputtered, and the material (for example, a Ti film) can be formed on the inner wall of the chamber other than the film forming area FFA and the magnetic poles of the ion guns I1 and I2. Since the getter process (step 102 and step 103 in FIG. 3 or step 104 and step 105 in FIG. 3) in which the sputtering of the preventing plate MS and the exhaust after sputtering are performed as a series of operations is repeated two or more times in this "getter process", it is desirable to continue the process until the pressure or the partial pressure of water ($H_2O$) in the process chamber 50 becomes equal to or less than a predetermined pressure. When the reactive gas is used in the getter process of step 33, the introduction of the reactive gas is stopped before the start of step 34.

In step 34, a cleaning process of the target used in the adhesive film formation is performed. A holder for holding the plurality of targets and ion guns is rotated, and targets T1 and T3 (for example, both are Ti targets) are directed to the areas other than a film forming area FFA (a side not facing the substrate S), and after the pressure of a process chamber 50 is stabilized, electric power is applied to the targets T1 and T3 to convert Ar gas into plasma, and the targets T1 and T3 are cleaned for a prescribed time with a preset power.

In step 35, an adhesive film forming process is performed. The holder for holding the plurality of targets and ion guns is rotated to direct targets T1 and T3 (for example, both are Ti targets) to a film forming area FFA (a side facing the substrate S). After the pressure in the process chamber 50 is stabilized, preset electric power is supplied to the targets T1 and T3 (for example, both are Ti targets) to convert the Ar gas into plasma. Then, in order to form the adhesive film (for example, a Ti film) on the substrate S, the carrier is started to be conveyed toward the film forming area FFA, and the carrier is allowed to pass through the film forming area FFA a predetermined number of times at a preset conveying speed to form the adhesive film (for example, a Ti film) on the substrate S.

In step 36, a cleaning process of the target used in the seed film formation is performed. The holder for holding the plurality of targets and ion guns is rotated to direct targets T2 and T4 (for example, both are Cu targets) to the side other than a film forming area FFA (the side not facing the substrate S), and after the pressure of a process chamber 50 is stabilized, electric power is applied to the targets T2 and T4 (for example, both are Cu targets) to convert Ar gas into plasma, and the targets T2 and T4 (for example, both are Cu targets) are cleaned at a predetermined time with preset power.

In step 37, a seed film forming process is performed. The holder for holding the plurality of targets and ion guns is rotated to direct targets T2 and T4 (for example, both are Cu targets) to a film forming area FFA (a side facing the substrate S). After the pressure in the process chamber 50 is stabilized, preset electric power is supplied to the targets T2 and T4 (for example, both are Cu targets) to convert the Ar gas into plasma. Then, in order to form a seed film (for example, a Cu film) on the adhesive film (for example, a Ti film), the carrier is started to be conveyed toward the film forming area FFA, and the carrier passes through the film forming area FFA a predetermined number of times at a preset conveying speed, thereby forming a seed film (for example, a Cu film) on the adhesive film (For example, a Ti film) formed on the substrate S.

In step 38, the carrier is removed from the holder 60 in the process chamber 50, and the carrier CR is ejected from the process chamber 50.

According to example 1-1, by providing the getter material supply source MS separately from the cathode for film formation, it is unnecessary to install a target as the getter material supply source to the rotary cathode, and the getter process can be carried out without being limited to the sputtering film type. In addition to the range in which a material having a large getter effect (for example, a Ti film) is formed on the inner wall of the chamber by ion beam sputtering, the preventing plate MS (for example, Ti), which is a getter material supply source MS, is activated by ion beam irradiation to act as an adsorption surface for gas molecules. Therefore, the area of the adsorption surface on which the gas molecules are adsorbed is widened, and a high getter effect can be obtained. Further, by performing the getter step a plurality of times in the getter process, the surface on which the gas molecules are adsorbed can be activated for each getter step, so that the adsorption effect is promoted, and the cleaning of the inside of the process chamber 50 is promoted because water ($H_2O$) gas is rapidly exhausted together with Ar gas when the supply of Ar gas is stopped.

Further, according to the present example 1-1, by constantly measuring the pressure in the process chamber 50 or the partial pressure of water ($H_2O$) in the process chamber 50 by the quadrupole type mass spectrometer RGA, the getter process can be continued until the pressure becomes equal to or less than a predetermined pressure, so that the atmosphere in the process chamber 50 at the time of forming the adhesive film can be stabilized.

Example 1-2

Next, a film forming method of example 1-2, which is a modification of example 1-1, will be described with reference to a flowchart of the film forming method of example 1-1 shown in FIG. 11. The film forming method of example 1-2 differs from the film forming method of example 1-1 in step 33. The basic configuration of the getter process 33 is the same as that of the film forming method shown in FIG. 2. That is, the getter step 33 shown in FIG. 11 comprises steps 102 to 105 of the film forming method shown in FIG. 2. The getter step comprises steps 102 and 103 or steps 104 and 105 of the film forming method shown in FIG. 2.

Step 33 will be described below with reference to the flowchart of FIG. 11 and FIG. 6. The process of step 31, step 32, and steps 34 to 38 are the same as the process of example 1-1, and therefore the description thereof is omitted.

Step 33 of example 1-2: in the getter process, as shown in FIG. 6, the holder for holding the plurality of targets and the ion guns is rotated to direct the targets T1 and T3 to a side other than the film forming area FFA (a side not facing the substrate S). After the pressure of the process chamber 50 is stabilized, preset electric power is supplied to the targets T1 and T3 to convert the Ar gas into plasma. Then, a material having a large getter effect on gas or water ($H_2O$) remaining on the inner wall of the process chamber 50 other than the film forming area FFA can be formed.

Example 1-3

Next, a film forming method of example 1-3, which is a modification of example 1-1, will be described with reference to a flowchart of the film forming method of example 1-1 shown in FIG. 11. The film forming method of example 1-3 differs from the film forming method of example 1-1 in step 33. The basic configuration of the getter process 33 is the same as that of the film forming method shown in FIG. 2. That is, the getter process 33 shown in FIG. 11 comprises steps 102 to 105 of the film forming method shown in FIG. 2. The getter step comprises steps 102 and 103 or steps 104 and 105 of the film forming method shown in FIG. 2.

Step 33 will be described below with reference to the flowchart of FIG. 11 and FIG. 5. The process of step 31, step 32, and steps 34 to 38 are the same as the process of example 1-1, and therefore the description thereof is omitted.

Step 33 of example 1-3: in the getter process, the above-described method using the ion guns I1 and I2 and the method using the targets T1 and T3 are used in combination. In this case, as shown in FIG. 5, the ion guns I1 and I2 are directed to a side other than the film forming area FFA (a side not facing the substrate S). At this time, the targets T1 and T3 are positioned opposite to the side wall of the inner wall of the process chamber 50. In this state, after the pressure in the process chamber 50 is stabilized, a voltage is applied to the ion guns I1 and I2, and preset electric power is supplied to the targets T1 and T3 to convert the Ar gas into plasma. A material having a large getter effect can be formed to the gas or water ($H_2O$) remaining on the side wall of the inner wall of the process chamber 50 of the film forming area FFA (the side facing the substrate S) and the inner wall of the process chamber 50 of the film forming area FFA (the side facing the substrate S).

The method using the ion guns I1 and I2 and the method using the targets T1 and T3 can be used in combination even in the case of FIG. 6. In this case, as shown in FIG. 6, the holder for holding the plurality of targets and the ion guns is rotated to direct the targets T1 and T3 to the side other than the film forming area FFA (the side not facing the substrate S). In this case, the ion guns I1 and I2 are positioned opposite to the side wall of the inner wall of the process chamber 50. In this state, after the pressure in the process chamber 50 is stabilized, a voltage is applied to the ion guns I1 and I2, and preset electric power is supplied to the targets T1 and T3 to convert the Ar gas into plasma. A material having a large getter effect can be formed to the gas or water ($H_2O$) remaining on the side wall of the inner wall of the process chamber 50 of the film forming area FFA (the side facing the substrate S) and the inner wall of the process chamber 50 of the film forming area FFA (the side facing the substrate S).

The method of using the ion guns I1 and I2 and the method of using the targets T1 and T3 may be used in combination with the case of FIG. 5 and the case of FIG. 6.

In this case, as shown in FIG. 5, the ion guns I1 and I2 are directed to a side other than the film forming area FFA (a side not facing the substrate S). In this state, after the pressure in the process chamber 50 is stabilized, a voltage is applied to the ion guns I1 and I2 to convert the Ar gas into plasma. A material having a large getter effect is adhered to the gas or water ($H_2O$) remaining on the side wall of the inner wall of the process chamber 50 of the film forming area FFA (the side facing the substrate S) and the inner wall of the process chamber 50 of the film forming area FFA (the side facing the substrate S).

At this time, the preventing plates MS1 and MS2 formed on the upper inner wall of the process chamber 50 are sputtered by the ion guns I1 and I2.

In this state, as shown in FIG. 6, when the holder for holding the plurality of targets and the ion guns is rotated to direct the targets T1 and T3 to the side other than the film forming area FFA (the side not opposed to the substrate S), the targets T1 and T3 face the upper inner wall of the process chamber 50. After the pressure of the process chamber 50 is stabilized, preset electric power is supplied to the targets T1 and T3 to convert the Ar gas into plasma. Thus, a material having a large getter effect can be formed on the preventing plates MS1 and MS2 formed on the upper inner wall of the process chamber 50 sputtered by the ion guns I1 and I2.

Example 2-1

Figure 12:
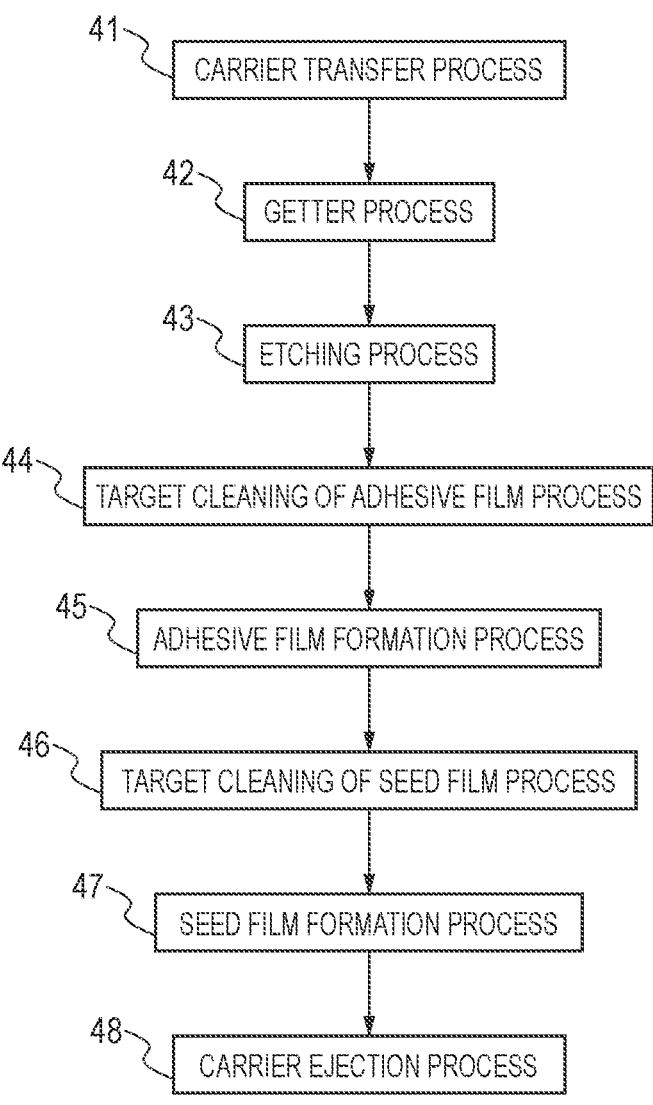
FIG. 12 is a diagram showing the flow of the film forming method of example 2-1, example 2-2, and example 2-3 of the second embodiment of the present invention.

In example 1-1 of FIG. 11, the getter process is performed between the etching process and the adhesive film forming process. An example in which the getter process is performed before the etching process will be described below as example 2-1. FIG. 12 is a flowchart showing the processing procedures of the film forming method of example 2-1, example 2-2, and example 2-3. The basic configuration of the getter process and the getter process 42 is the same as that of the film forming method shown in FIG. 2. That is, the getter process 42 of FIG. 6 comprises steps 102 to 105 of the film forming method of FIG. 2. The getter step comprises steps 102 and 103 or steps 104 and 105 of the film forming method shown in FIG. 2.

In step 41, the carrier CR is transferred to the holder 60 in the process chamber 50.

In step 42, a getter process is performed. The holder for holding the plurality of targets and the ion guns is rotated to direct the ion guns I1 and I2 to other than the film forming area FFA. On the inner wall of the chamber of the process chamber 50 other than the film forming area FFA, the preventing plate (e.g. made of Ti) is provided as a getter material supply source MS. When a voltage is applied to the ion guns I1 and I2 in this state to convert Ar gas into plasma, the preventing plate (e.g. made of Ti) is sputtered, and a material having a large getter effect (for example, a Ti film) can be formed on the inner wall of the chamber other than the film forming area FFA and the magnetic pole of the ion gun. Since this "getter process" is performed by performing a getter process in which sputtering of a Ti preventing plate and exhaust after sputtering are performed as a series of operations, and this operation is repeated 2 or more times, it is desirable to continue until the pressure or $H_2O$ partial pressure in the process chamber 50 becomes a predetermined pressure or less.

In step 43, an etching process is performed. The holder for holding the plurality of targets and the ion guns is rotated to direct the ion guns I1 and I2 to the film forming area FFA. After the pressure in the process chamber 50 is stabilized, a voltage is applied to the ion guns I1 and I2 to convert the Ar gas into plasma. Then, in order to perform the etching process, the carrier CR is started to be conveyed toward the film forming area FFA, and the substrate S is etched by passing the carrier CR through the film forming area FFA (the side opposite to the substrate S) a predetermined number of times at a preset conveying speed. When the etching process is completed, voltage application to the ion guns I1 and I2 is stopped. In the present embodiment, Ar gas is used as the introduction gas from the gas introduction device G1, but the present invention is not limited to this, and reactive gases such as nitrogen, oxygen, and hydrogen can also be used.

In step 44, a cleaning process of the target used in the adhesive film formation is performed. After the pressure of a process chamber 50 is stabilized by rotating the holder for holding the plurality of targets and ion guns, the targets T1 and T3 (for example, both are Ti targets) are directed to the side other than a film forming area FFA (the side not opposed to a substrate S), electric power is applied to the targets T1 and T3 (for example, both are Ti targets) to make Ar gas into plasma, and the targets T1 and T3 (for example, both are Ti targets) are cleaned for a prescribed time with a preset power.

In step 45, an adhesive film forming process is performed. The holder for holding the plurality of targets and ion guns is rotated to direct targets T1 and T3 (for example, both are Ti targets) to a film forming area FFA (a side opposed to a substrate S). After the pressure of the process chamber 50 is stabilized, preset electric power is supplied to the targets T1 and T3 (for example, both are Ti targets) Ti to convert the Ar gas into plasma. Then, in order to form the adhesive film (for example, a Ti film), the carrier CR is started to be conveyed toward the film forming area FFA, and the carrier CR is passed through the film forming area FFA a predetermined number of times at a predetermined conveying speed, thereby forming the adhesive film (for example, a Ti film) on the substrate S.

In step 46, a cleaning process of the target used in the seed film formation is performed. After the pressure of the process chamber 50 is stabilized by rotating the holder for holding the plurality of targets and ion guns, the targets T2 and T4 (for example, both are Cu targets) are directed to the area other than the film forming area FFA, electric power is applied to the targets T2 and T4 (for example, both are Cu targets) to convert the Ar gas into plasma, and the targets T2 and T4 (for example, both are Cu targets) are cleaned for a prescribed time with preset power.

In step 47, a seed film forming process is performed. The holder for holding the plurality of targets and ion guns is rotated to direct targets T2 and T4 (for example, both are Cu targets) to a film forming area FFA (a side opposed to a substrate S). After the pressure in the process chamber 50 is stabilized, preset electric power is supplied to the targets T2 and T4 (for example, both are Cu targets) to convert the Ar gas into plasma. Then, in order to form a seed film (for example, a Cu film), the carrier CR is started to be conveyed toward the film forming area FFA, and the carrier CR is passed through the film forming area FFA a predetermined number of times at a predetermined conveying speed, thereby forming a seed film (for example, a Cu film) on the adhesive film formed on the substrate S.

In step 48, the carrier is removed from the holder 60 in the process chamber 50, and the carrier CR is ejected from the process chamber 50.

According to example 2-1, a material having a large getter effect (for example, a Ti film) can be formed to the inner wall of the chamber other than the film forming area FFA before the etching process, and further, a material having a large getter effect (for example, a Ti film) is coated on the magnetic pole of the ion gun in the getter process, so that an active adsorption surface having a getter effect is exposed in the film forming area FFA during the etching process, and therefore, water ($H_2O$) gas exhausted from the substrate S by etching can be adsorbed in real time.

Example 2-2

Next, a film forming method of example 2-2, which is a modification of example 2-1, will be described with reference to a flowchart of the film forming method of example 2-1 shown in FIG. 12. The film forming method of example 2-2 differs from the film forming method of example 2-1 in step 42. The basic configuration of the getter step 42 is the same as that of the film forming method shown in FIG. 2. That is, the getter process 33 shown in FIG. 12 comprises steps 102 to 105 of the film forming method shown in FIG. 2. The getter step comprises steps 102 and 103 or steps 104 and 105 of the film forming method shown in FIG. 2.

Step 42 will be described below with reference to the flowchart of FIG. 12 and FIG. 6. Since the process of step 41 and steps 43 to 48 are the same as the steps of example 2-1, description thereof will be omitted.

Step 42 of example 2-2: in the getter process, as shown in FIG. 6, the holder for holding the plurality of targets and the ion guns is rotated to direct the targets T1 and T3 to a side other than the film forming area FFA (a side not facing the substrate S). After the pressure of the process chamber 50 is stabilized, preset electric power is supplied to the targets T1 and T3 to convert the Ar gas into plasma. Then, a material having a large getter effect on gas or water ($H_2O$) remaining on the inner wall of the process chamber 50 other than the film forming area FFA can be formed.

Example 2-3

Next, a film forming method of example 2-3, which is a modification of example 2-1, will be described with reference to a flowchart of the film forming method of example 2-1 shown in FIG. 12. The film forming method of example 2-3 differs from the film forming method of example 2-1 in step 42. The basic configuration of the getter process 42 is the same as that of the film forming method shown in FIG. 2. That is, the getter process 42 shown in FIG. 12 comprises steps 102 to 105 of the film forming method shown in FIG. 2. The getter step comprises steps 102 and 103 or steps 104 and 105 of the film forming method shown in FIG. 2.

Step 42 will be described below with reference to the flowchart of FIG. 12 and FIG. 5. Since the process of step 41 and steps 43 to 48 are the same as the process of example 2-1, description thereof will be omitted.

Step 33 of example 2-3: The getter process is performed by combining the method using the ion guns I1 and I2 and the method using the targets T1 and T3. In this case, as shown in FIG. 5, the ion guns I1 and I2 are directed to a side other than the film forming area FFA (a side not facing the substrate S). At this time, the targets T1 and T3 are positioned opposite to the side wall of the inner wall of the process chamber 50. In this state, after the pressure in the process chamber 50 is stabilized, a voltage is applied to the ion guns I1 and I2, and preset electric power is supplied to the targets T1 and T3 to convert the Ar gas into plasma. A material having a large getter effect can be formed to the gas or water ($H_2O$) remaining on the side wall of the inner wall of the process chamber 50 of the film forming area FFA (the side facing the substrate S) and the inner wall of the process chamber 50 of the film forming area FFA (the side facing the substrate S).

The method using the ion guns I1 and I2 and the method using the targets T1 and T3 can be used in combination even in the case of FIG. 6. In this case, as shown in FIG. 6, the holder for holding the plurality of targets and the ion guns is rotated to direct the targets T1 and T3 to the side other than the film forming area FFA (the side not facing the substrate S). In this case, the ion guns I1 and I2 are positioned opposite to the side wall of the inner wall of the process chamber 50. In this state, after the pressure in the process chamber 50 is stabilized, a voltage is applied to the ion guns I1 and I2, and preset electric power is supplied to the targets T1 and T3 to convert the Ar gas into plasma. A material having a large getter effect can be formed to the gas or water (H$_2$O) remaining on the side wall of the inner wall of the process chamber 50 of the film forming area FFA (the side facing the substrate S) and the inner wall of the process chamber 50 of the film forming area FFA (the side facing the substrate S).

The method of using the ion guns I1 and I2 and the method of using the targets T1 and T3 may be used in combination with the case of FIG. 5 and the case of FIG. 6.

In this case, as shown in FIG. 5, the ion guns I1 and I2 are directed to a side other than the film forming area FFA (a side not facing the substrate S). In this state, after the pressure in the process chamber 50 is stabilized, a voltage is applied to the ion guns I1 and I2 to convert the Ar gas into plasma. A material having a large getter effect is formed to the gas or water (H$_2$O) remaining on the side wall of the inner wall of the process chamber 50 of the film forming area FFA (the side facing the substrate S) and the inner wall of the process chamber 50 of the film forming area FFA (the side facing the substrate S).

At this time, the preventing plates MS1 and MS2 formed on the upper inner wall of the process chamber 50 are sputtered by the ion guns I1 and I2.

In this state, as shown in FIG. 6, when the holder for holding the plurality of targets and the ion guns is rotated to direct the targets T1 and T3 to the side other than the film forming area FFA (the side not opposed to the substrate S), the targets T1 and T3 face the upper inner wall of the process chamber 50. After the pressure of the process chamber 50 is stabilized, preset electric power is supplied to the targets T1 and T3 to convert the Ar gas into plasma. Thus, a material having a large getter effect can be formed on the preventing plates MS1 and MS2 formed on the upper inner wall of the process chamber 50 sputtered by the ion guns I1 and I2.

Example 3-1

Figure 13:
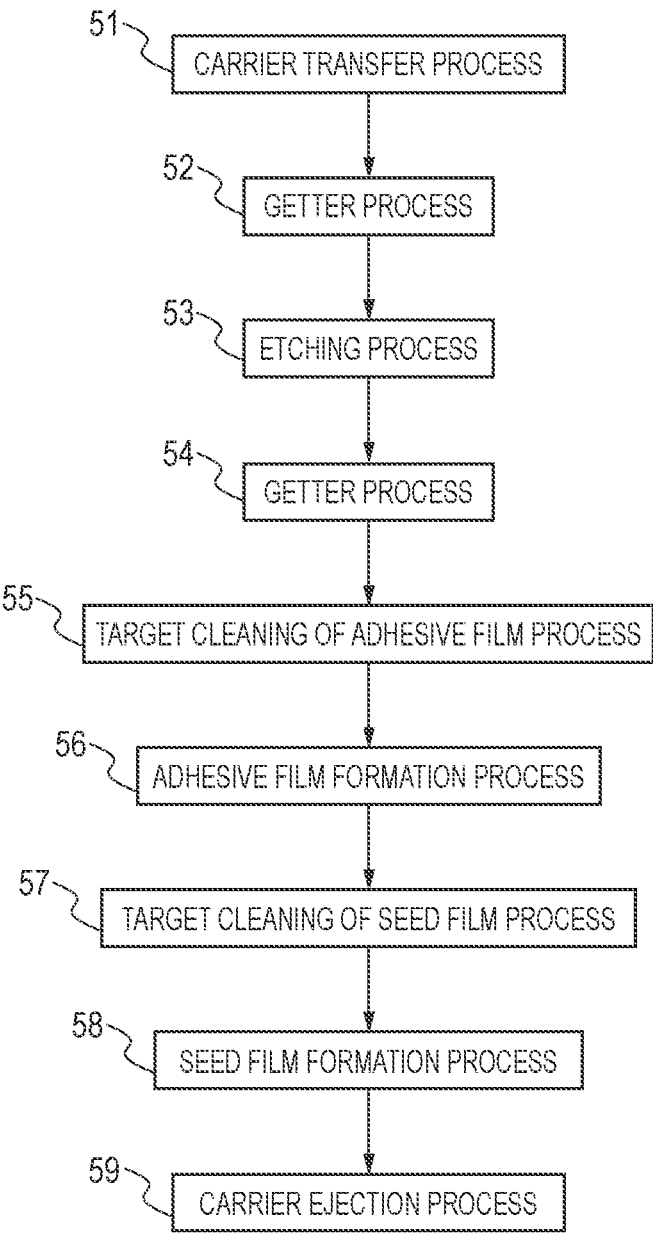
FIG. 13 is a diagram showing the flow of the film forming method of example 3-1, example 3-2, and example 3-3 of the second embodiment of the present invention.

Although the example of performing the getter process between the etching process and the adhesive film forming process has been described in example 1-1 and the example of performing the getter process before the etching process in example 2-1, the getter process may be performed before the etching process and between the etching process and the adhesive film forming process. The examples in which the getter process is performed both before the etching process and between the etching process and the adhesive film forming process will be described below as example 3-1. FIG. 13 is a flowchart of the film forming method of examples 3-1, 3-2, and 3-3. The basic configuration of the getter process 52 and the getter process 54 is the same as that of the film forming method shown in FIG. 2. That is, the getter process 42 of FIG. 6 comprises steps 102 to 105 of the film forming method of FIG. 2. The getter step comprises steps 102 and 103 or steps 104 and 105 of the film forming method shown in FIG. 2.

In step 51, the carrier CR is transferred to the holder 60 in the process chamber 50.

In step 52, a getter process is performed. The holder for holding the plurality of targets and the ion guns is rotated to direct the ion guns I1 and I2 to the areas other than the film forming area FFA. On the inner wall of the chamber of the process chamber 50 other than the film forming area FFA, the preventing plate (e.g. made of Ti) is provided as a getter material supply source MS. When a voltage is applied to the ion guns I1 and I2 in this state to convert Ar gas into plasma, the preventing plate (e.g. made of Ti) is sputtered, and a Ti film can be formed to the inner wall of the chamber other than the film forming area FFA and the magnetic poles of the ion guns I1 and I2. This "getter process" is a getter process in which sputtering of a Ti preventing plate and exhaust after sputtering are performed as a series of operations, and this operation is repeated 2 or more times, so that it is desirable to continue until the pressure or H$_2$O partial pressure in the process chamber 50 becomes a predetermined pressure or less.

In step 53, an etching process is performed. The holder for holding the plurality of targets and the ion guns is rotated to direct the ion guns I1 and I2 to the film forming area FFA. After the pressure in the process chamber 50 is stabilized from the gas introduction device G1, a voltage is applied to the ion guns I1 and I2 to convert the Ar gas into plasma. Then, in order to perform the etching process, the carrier CR is started to be conveyed toward the film forming area FFA, and the substrate S is etched by passing through the film forming area FFA for a specified number of times at a preset conveying speed. When the etching process is completed, the voltage application to the ion gun is stopped. In the present embodiment, an Ar gas is used as the introducing gas, but the present invention is not limited to this, and a reactive gas such as nitrogen, oxygen or hydrogen can be used.

In step 54, a getter process is performed. The holder for holding the plurality of targets and the ion guns is rotated to direct the ion guns I1 and I2 to the areas other than the film forming area FFA. On the inner wall of the chamber of the process chamber 50 other than the film forming area FFA, the preventing plate (e.g. made of Ti) is provided as a getter material supply source MS. When a voltage is applied to the ion guns I1 and I2 in this state to convert Ar gas into plasma, the preventing plate (e.g. made of Ti) is sputtered, and a material having a large getter effect (for example, a Ti film) can be formed on the inner wall of the chamber other than the film forming area FFA and the magnetic poles of the ion guns I1 and I2. This "getter process" is a getter process in which sputtering of a Ti preventing plate and exhaust after sputtering are performed as a series of operations, and this operation is repeated 2 or more times, so that it is desirable to continue until the pressure or H$_2$O partial pressure in the process chamber 50 becomes a predetermined pressure or less.

In step 55, a cleaning process of the target used in the adhesive film formation is performed. The holder for holding the plurality of targets and ion guns is rotated so that targets T1 and T3 (for example, a Ti target) are directed to a side other than a film forming area FFA (a side not opposed to a substrate S), and after the pressure in a process chamber is stabilized, electric power is applied to the targets T1 and T3 (for example, a Ti target) to convert Ar gas into plasma, and the targets T1 and T3 (for example, a Ti target) are cleaned for a prescribed time with a preset power.

In step 56, an adhesive film forming step is performed. The holder for holding the plurality of targets and ion guns is rotated to direct targets T1 and T3 (for example, both are Ti targets) to a film forming area FFA. After the pressure of the process chamber 50 is stabilized, preset electric power is supplied to the targets T1 and T3 (for example, both are Ti targets) to convert the Ar gas into plasma. Then, in order to form the adhesive film (for example, a Ti film), the carrier CR is started to be conveyed toward the film forming area FFA, and the carrier CR is passed through the film forming area FFA a predetermined number of times at a predetermined conveying speed, thereby forming the adhesive film (for example, a Ti film) on the substrate S.

In step 57, a cleaning process of the target used in the seed film formation is performed. The holder for holding the plurality of targets and ion guns is rotated to direct targets T2 and T4 (for example, both are Cu targets) to the side other than a film forming area FFA (a side not opposed to a substrate S), and after the pressure of a process chamber 50 is stabilized, power is applied to a Cu target to convert Ar gas into plasma, and targets T2 and T4 (for example, both are Cu targets) are cleaned for a prescribed time with a preset power.

In step 58, a seed film forming process is performed. The holder for holding the plurality of targets and ion guns is rotated to direct targets T2 and T4 (for example, both are Cu targets) to a film forming area FFA (a side opposed to a substrate S). After the pressure in the process chamber 50 is stabilized, preset electric power is supplied to the targets T2 and T4 (for example, both are Cu targets) to convert the Ar gas into plasma. Then, in order to form a seed film (for example, a Cu film), the carrier CR is started to be conveyed toward the film forming area FFA, and the carrier CR is passed through the film forming area FFA a predetermined number of times at a predetermined conveying speed, thereby forming a seed film (for example, a Cu film) on the adhesive film formed on the substrate S.

In step 59, the carrier CR is removed from the holder 60 in the process chamber 50 and ejected from the process chamber 50.

According to the present example 3-1, the effects of both the above-described example 1-1 and the example 2-1 can be exhibited. Concretely, the effect of a real time getter effect during the etching process and the effect of cleaning the atmosphere in the process chamber before the adhesive film forming process can be expected.

Example 3-2

Next, a film forming method of example 3-2, which is a modification of example 3-1, will be described with reference to a flowchart of the film forming method of example 3-1 shown in FIG. 13. The film forming method of example 3-2 differs from the film forming method of example 3-1 in steps 52 and 54. The basic configuration of the getter process 52 and the getter process 54 is the same as that of the film forming method shown in FIG. 2. That is, the getter process 52 and the getter process 54 in FIG. 13 comprise steps 102 to 105 of the film forming method in FIG. 2. The getter step comprises steps 102 and 103 or steps 104 and 105 of the film forming method shown in FIG. 2.

Steps 52 and 54 will be described below with reference to the flowchart of FIG. 13 and FIG. 6. The process of step 51, step 53, and steps 55 to 58 are the same as the process of example 3-1, and therefore description thereof is omitted.

In the getter step 52 and step 54 of the example 3-2, as shown in FIG. 6, the holder for holding the plurality of targets and the ion guns is rotated to direct the targets T1 and T3 to the side other than the film forming area FFA (the side not facing the substrate S). After the pressure of the process chamber 50 is stabilized, preset electric power is supplied to the targets T1 and T3 to convert the Ar gas into plasma. Then, a material having a large getter effect on gas or water (H$_2$O) remaining on the inner wall of the process chamber 50 other than the film forming area FFA can be formed.

Example 3-3

Next, a film forming method of example 3-3, which is a modification of example 3-1, will be described with reference to a flowchart of the film forming method of example 3-1 shown in FIG. 13. The film forming method of example 3-3 differs from the film forming method of example 3-1 in steps 52 and 54. The basic configuration of the getter process 52 and the getter process 54 is the same as that of the film forming method shown in FIG. 2. That is, the getter process 52 and the getter process 54 in FIG. 13 comprise steps 102 to 105 of the film forming method in FIG. 2. The getter step comprises steps 102 and 103 or steps 104 and 105 of the film forming method shown in FIG. 2.

Steps 52 and 54 will be described below with reference to the flowchart of FIG. 13 and FIG. 5. The process of step 51, step 53, and steps 55 to 58 are the same as the steps of example 3-1, and therefore description thereof is omitted.

Steps 52 and 54 of example 3-3: in the getter process, the above-described method using the ion guns I1 and I2 and the method using the targets T1 and T3 are used in combination. In this case, as shown in FIG. 5, the ion guns I1 and I2 are directed to a side other than the film forming area FFA (a side not facing the substrate S). At this time, the targets T1 and T3 are positioned opposite to the side wall of the inner wall of the process chamber 50. In this state, after the pressure in the process chamber 50 is stabilized, a voltage is applied to the ion guns I1 and I2, and preset electric power is supplied to the targets T1 and T3 to convert the Ar gas into plasma. A material having a large getter effect can be formed to the gas or water (H$_2$O) remaining on the side wall of the inner wall of the process chamber 50 of the film forming area FFA (the side facing the substrate S) and the inner wall of the process chamber 50 of the film forming area FFA (the side facing the substrate S).

The method using the ion guns I1 and I2 and the method using the targets T1 and T3 can be used in combination even in the case of FIG. 6. In this case, as shown in FIG. 6, the holder for holding the plurality of targets and the ion guns is rotated to direct the targets T1 and T3 to the side other than the film forming area FFA (the side not facing the substrate S). In this case, the ion guns I1 and I2 are positioned opposite to the side wall of the inner wall of the process chamber 50. In this state, after the pressure in the process chamber 50 is stabilized, a voltage is applied to the ion guns I1 and I2, and preset electric power is supplied to the targets T1 and T3 to convert the Ar gas into plasma. A material having a large getter effect can be formed to the gas or water (H$_2$O) remaining on the side wall of the inner wall of the process chamber 50 of the film forming area FFA (the side facing the substrate S) and the inner wall of the process chamber 50 of the film forming area FFA (the side facing the substrate S).

The method of using the ion guns I1 and I2 and the method of using the targets T1 and T3 may be used in combination with the case of FIG. 5 and the case of FIG. 6.

In this case, as shown in FIG. 5, the ion guns I1 and I2 are directed to a side other than the film forming area FFA (a side not facing the substrate S). In this state, after the pressure in the process chamber 50 is stabilized, a voltage is applied to the ion guns I1 and I2 to convert the Ar gas into plasma. A material having a large getter effect is formed to the gas or water ($H_2O$) remaining on the side wall of the inner wall of the process chamber 50 of the film forming area FFA (the side facing the substrate S) and the inner wall of the process chamber 50 of the film forming area FFA (the side facing the substrate S).

At this time, the preventing plates MS1 and MS2 formed on the upper inner wall of the process chamber 50 are sputtered by the ion guns I1 and I2.

In this state, as shown in FIG. 6, when the holder for holding the plurality of targets and the ion guns is rotated to direct the targets T1 and T3 to the side other than the film forming area FFA (the side not facing the substrate S), the targets T1 and T3 face the upper inner wall of the process chamber 50. After the pressure of the process chamber 50 is stabilized, preset electric power is supplied to the targets T1 and T3 to convert the Ar gas into plasma. Thus, a material having a large getter effect can be formed on the preventing plates MS1 and MS2 formed on the upper inner wall of the process chamber 50 sputtered by the ion guns I1 and I2.

Comparison Example

Figure 14:
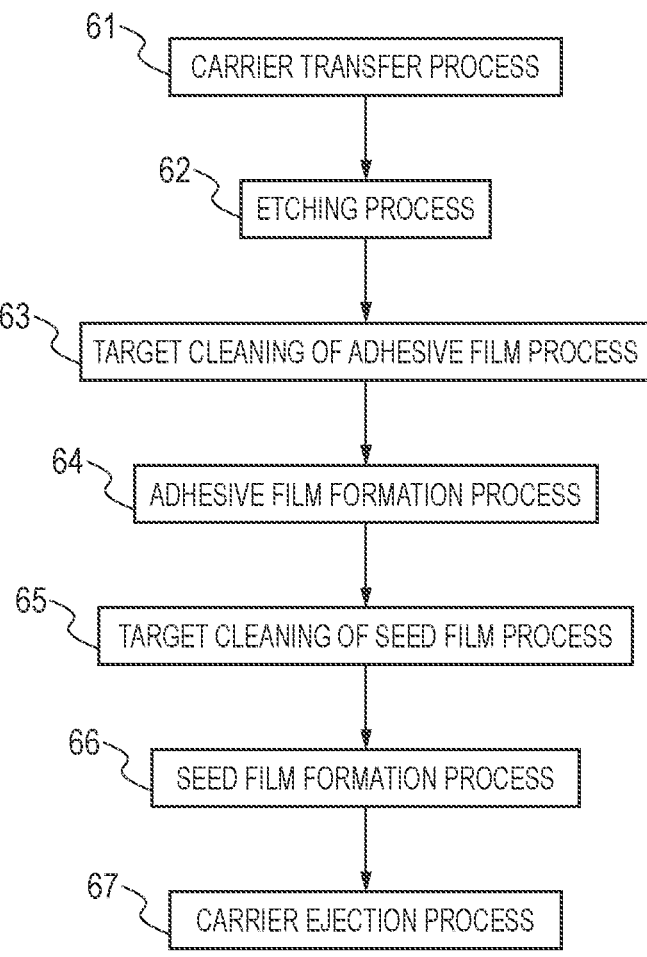
FIG. 14 shows the flow of a conventional process for the film forming method.

The adhesive film forming process was carried out in the conventional step (the aforementioned Japanese Patent Application Laid-Open No. H07-310180) in which the getter process of the present invention was not carried out. FIG. 14 is a flowchart showing the processing procedure of the film forming method in which the getter process is not performed.

In step 61, the carrier CR is transferred to the holder 60 in the process chamber 50.

In step 62, an etching process is performed. The holder for holding the plurality of targets and the ion guns is rotated to direct the ion guns I1 and I2 to the film forming area FFA. After the pressure in the process chamber 50 is stabilized, a voltage is applied to the ion guns I1 and I2 to convert the Ar gas into plasma. Then, in order to perform the etching process, the carrier CR is started to be conveyed toward the film forming area FFA, and the substrate S is etched by passing through the film forming area FFA for a specified number of times at a preset conveying speed. When the etching process is completed, voltage application to the ion guns I1 and I2 is stopped. In the present embodiment, an Ar gas is used as the introducing gas, but the present invention is not limited to this, and a reactive gas such as nitrogen, oxygen or hydrogen can be used.

In step 63, a cleaning process of the target used in the adhesive film formation is performed. After the pressure of the process chamber 50 is stabilized by rotating the holder for holding the plurality of targets and ion guns, the targets T1 and T3 (for example, both are Ti targets) are directed to the areas other than the film forming area FFA, electric power is applied to the targets T1 and T3 (for example, both are Ti targets) to convert the Ar gas into plasma, and the targets T1 and T3 (for example, both are Ti targets) are cleaned for a prescribed time with preset power.

In step 64, an adhesive film forming process is performed. The holder for holding the plurality of targets and ion guns is rotated to direct targets T1 and T3 (for example, both are Ti targets) to a film forming area FFA (a side opposed to a substrate S). After the pressure of the process chamber 50 is stabilized, preset electric power is supplied to the targets T1 and T3 (for example, both are Ti targets) to convert the Ar gas into plasma. Then, in order to form the adhesive film (for example, a Ti film), the carrier CR is started to be conveyed toward the film forming area FFA, and the carrier CR is passed through the film forming area FFA a predetermined number of times at a predetermined conveying speed, thereby forming the adhesive film (for example, a Ti film) on the substrate S.

In step 65, a cleaning process of the target used in the seed film formation is performed. After the pressure of the process chamber 50 is stabilized by rotating the holder for holding the plurality of targets and ion guns, the targets T2 and T4 (for example, both are Cu targets) are directed to the area other than the film forming area FFA, electric power is applied to the targets T2 and T4 (for example, both are Cu targets) to convert the Ar gas into plasma, and the targets T2 and T4 (for example, both are Cu targets) are cleaned for a prescribed time with preset power.

In step 66, a seed film forming process is performed. The holder for holding the plurality of targets and ion guns is rotated to direct targets T2 and T4 (for example, both are Cu targets) to a film forming area FFA. After the pressure in the process chamber 50 is stabilized, preset electric power is supplied to the targets T2 and T4 (for example, both are Cu targets) to convert the Ar gas into plasma. Then, in order to form a seed film (for example, a Cu film), the carrier CR is started to be conveyed toward the film forming area FFA, and the carrier CR is passed through the film forming area FFA a predetermined number of times at a predetermined conveying speed, thereby forming a seed film (for example, a Cu film) on the adhesive film formed on the substrate S.

In step 67, the carrier CR is removed from the holder 60 in the process chamber 50 and ejected from the process chamber 50.

Figure 15:
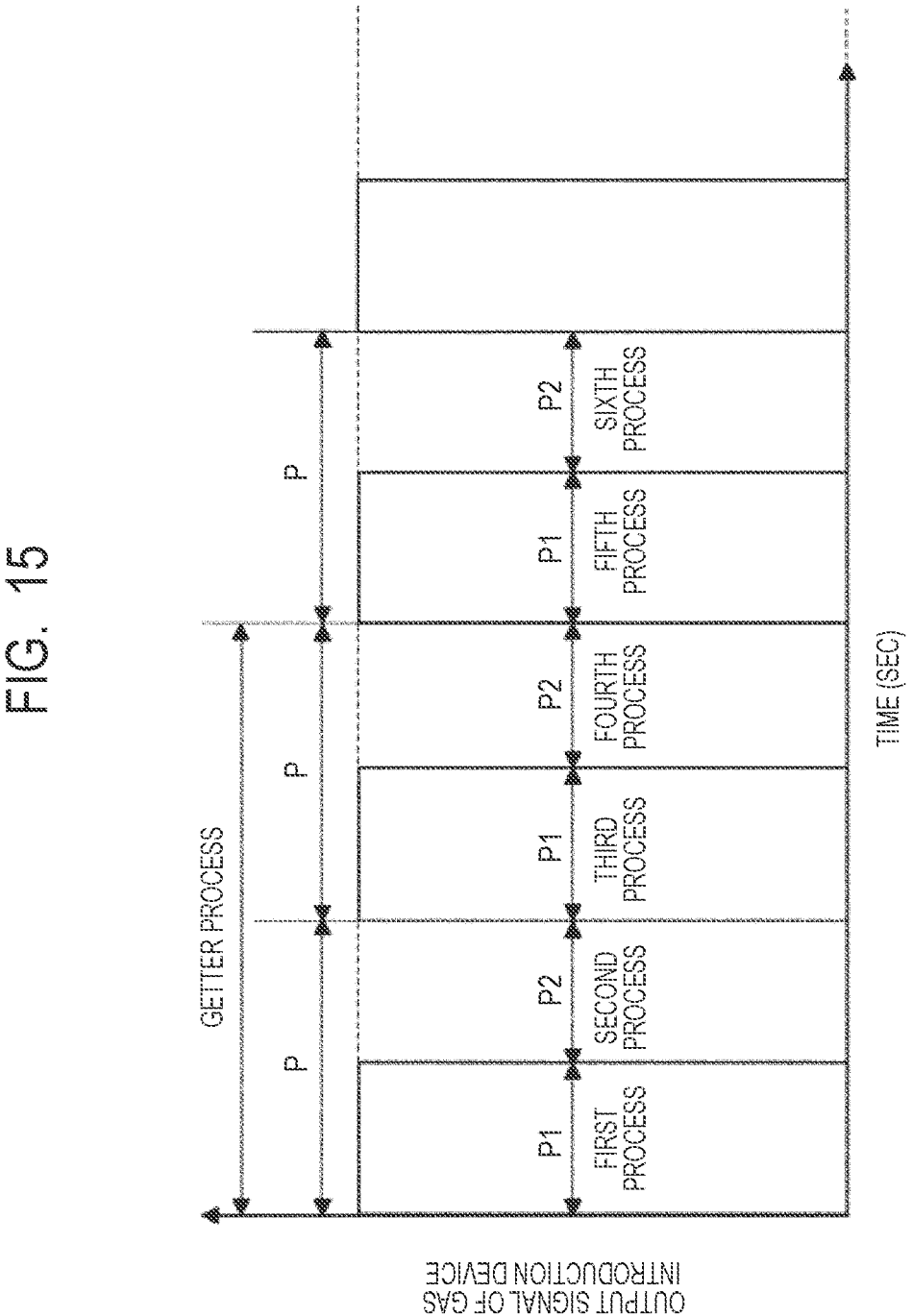
FIG. 15 shows an example of an output signal of a gas introduction system in a getter process of the present invention (first and second embodiments).

FIG. 15 is a diagram showing an example of an output signal of the gas introduction device 1024 when the getter step is repeated two or more times in the getter process of the first embodiment (example 1-1 to example 1-3) and the second embodiment (example 1-1 to example 1-3, example 2-1 to example 2-3, example 3-1 to example 3-3). Ar gas is supplied to the process chamber 50. In the output signal of the gas introduction device 1024, the period of the gas introduction device output signal (the period of the getter step) is P, the gas supply time (time for supplying Ar gas to the process chamber 50 and time for forming a film of a material having a large getter effect on gas or water ($H_2O$) remaining in the process chamber 50) is P1, the predetermined time, the time for exhausting the process chamber 50 is P2, and the duty cycle is D=P1/P.

In P1, it is preferable that the Ar gas supplied to the process chamber 50 is started to be supplied into the process chamber at the same time as the start of the first process or the third process shown in FIG. 3, and the supply into the process chamber is stopped at the same time as the end of the first process or the third process.

It is preferable that the exhaust gas in the process chamber 50 starts before or at the same time as the start of the first process shown in FIG. 3.

In P2, it is preferable that the exhaust gas from the process chamber 50 is exhausted for a predetermined period of time while the supply of Ar gas into the process chamber is stopped at the same time as the end of the first process or the third process shown in FIG. 3.

Ar gas is supplied into the process chamber 50 by a gas introduction device G1 of the film forming apparatus shown in FIGS. 1 and 9, and exhaust gas into the process chamber 50 is exhausted by an exhaust device V50 of the film forming apparatus shown in FIGS. 1 and 9.

Figure 16:
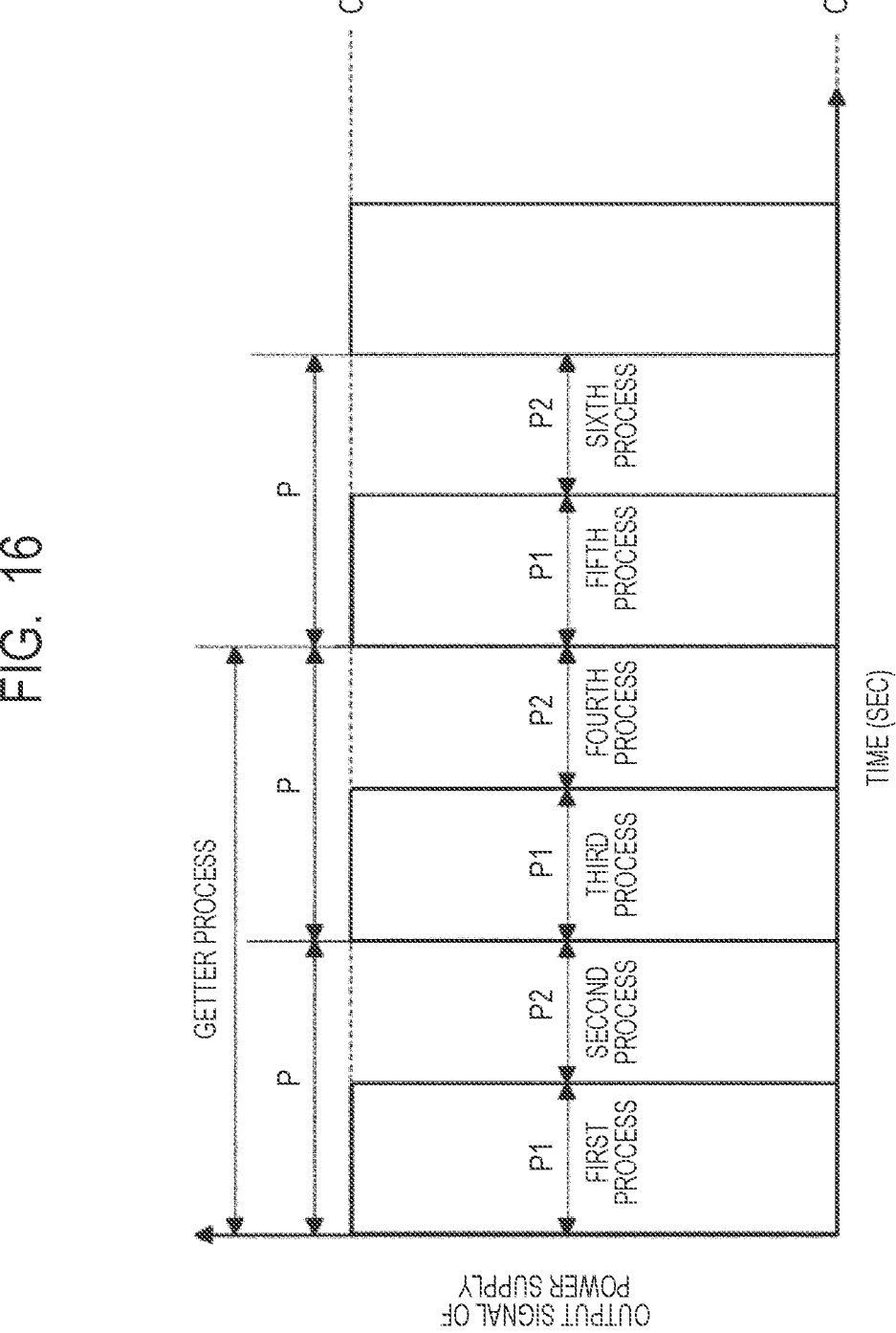
FIG. 16 shows an example of an output signal of a power supply (IG) in the getter process of the present invention (first and second embodiments).

FIG. 16 is a diagram showing an example of an output signal of the power supply (SP) 1022 or the 1023 power supply (IG) 1023 when the getter process is repeated two or more times in the getter process of the first embodiment (example 1-1 to example 1-3) and the second embodiment (example 1-1 to example 1-3, example 2-1 to example 2-3, example 3-1 to example 3-3). In this case, Ar gas is supplied to the process chamber 50. In the output signal of the power supply (SP) 1022 or the power supply (IG) 1023, the cycle of the power supply output signal (the cycle of the getter step) is P, the gas supply time (the time for forming a material having a large getter effect with respect to gas or water ($H_2O$) remaining in the process chamber 50) is P1, the predetermined time, the time for exhausting the process chamber 50 is P2, and the duty cycle is D=P1/P, which are output in synchronization with the gas introduction device of FIG. 15.

In P1, the power supplied to the process chamber 50 starts to be supplied into the process chamber at the same time as the start of the first process or the third process shown in FIG. 3, and stops to be supplied into the process chamber at the same time as the end of the first process or the third process.

It is preferable that the exhaust gas in the process chamber 50 starts before or at the same time as the start of the first process shown in FIG. 3.

In P2, it is preferable that the exhaust gas from the process chamber 50 is exhausted for a predetermined period of time while the supply of Ar gas into the process chamber is stopped at the same time as the end of the first process or the third process shown in FIG. 3.

The output signal of the power supply (SP) 1022 or the power supply (IG) 1023 shown in FIGS. 2 and 10 is used to output power to the process chamber 50, and the exhaust device V50 of the film forming apparatus shown in FIGS. 1 and 9 is used to exhaust power to the process chamber 50.

Figure 17:
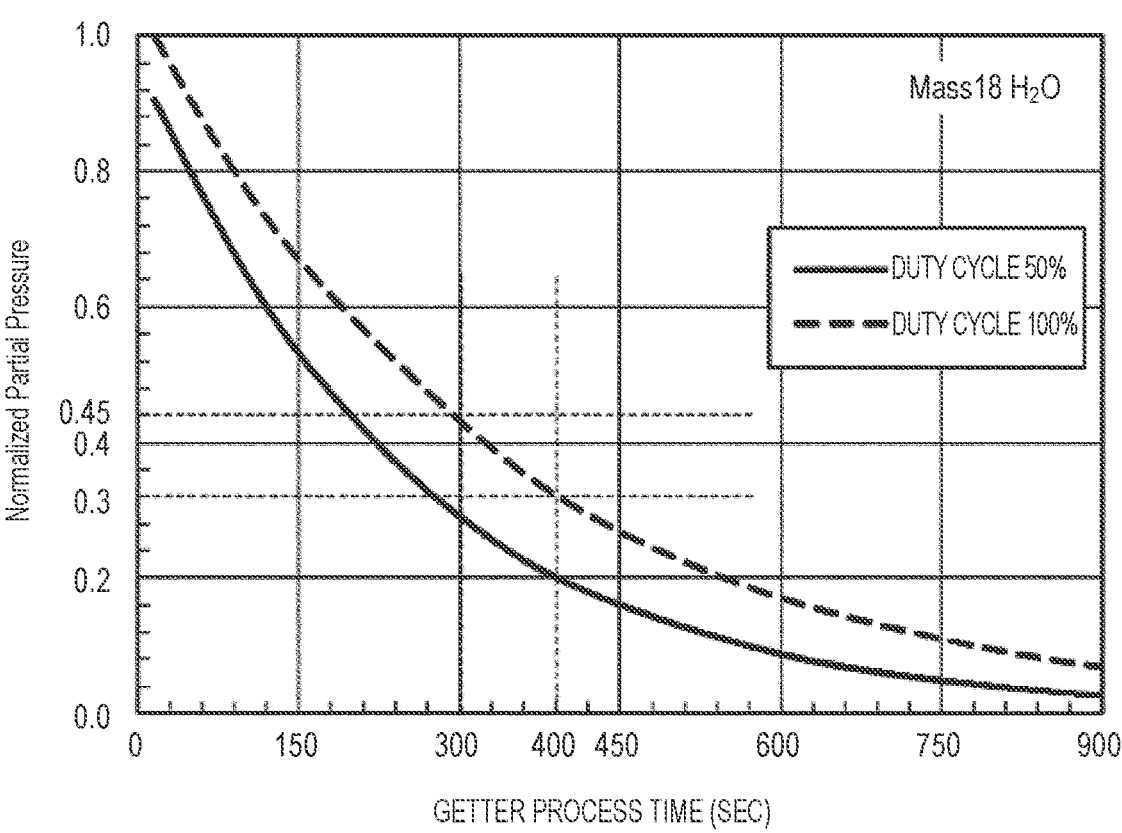
FIG. 17 is a diagram showing the relationship between the time of the getter process and the partial pressure of water ($H_2O$) in the process chamber after the getter process, when the film forming method of the first embodiment (example 1-2), the second embodiment (example 1-2, example 2-2, example 3-2) and the conventional process is applied.

FIG. 17 is a diagram showing the relationship between the time of the getter process and the partial pressure of water ($H_2O$) in the process chamber after the getter process in the film forming method of example 1-2 of the first embodiment and example 1-2, example 2-2 and example 3-2 of the second embodiment.

The inventors have found that it is desirable that the partial pressure of water ($H_2O$) is 0.3 or less when the adhesion between the substrate and the adhesive film is considered without lowering productivity.

When the getter process time was 300 seconds, the partial pressure of water ($H_2O$) became 0.3 when the getter step was repeated 2 or more times with a duty cycle of 50% as shown in FIG. 17. On the other hand, when the getter process time was 300 seconds, the partial pressure of water ($H_2O$) was 0.45 when the duty cycle was 100% for performing the getter step once, as shown in FIG. 17. When the getter step is repeated 2 times or more at a duty cycle of 50%, the partial pressure of water ($H_2O$) can be reduced to about ⅔ (0.3/0.45) as compared with the partial pressure of water ($H_2O$) when the getter step is performed once.

On the other hand, as shown in FIG. 17, when the getter step is performed once, it takes 400 seconds for the getter process time for the $H_2O$ partial pressure to become 0.3. Thus, if the getter step is repeated two or more times with a duty cycle of 50%, the getter process time can be shortened by 100 seconds (400 seconds). Therefore, when the getter step is repeated two or more times with a duty cycle of 50%, the throughput can be reduced to about ¾ (300/400) as compared with the case where the getter step is performed once with a duty cycle of 100%.

When the getter process (example 1-1 and example 1-3 of the first embodiment, and example 1-1, example 1-3, example 2-1, example 2-3, example 3-1, and example 3-3 of the second embodiment) of the other film forming method described above is performed, a material having a large getter effect can be formed to the gas or water ($H_2O$) remaining in the inner wall of the chamber of the process chamber 50 of the film forming area FFA and the magnetic pole of the ion gun, so that a better effect can be obtained than in the case shown in FIG. 17.

Figure 18:
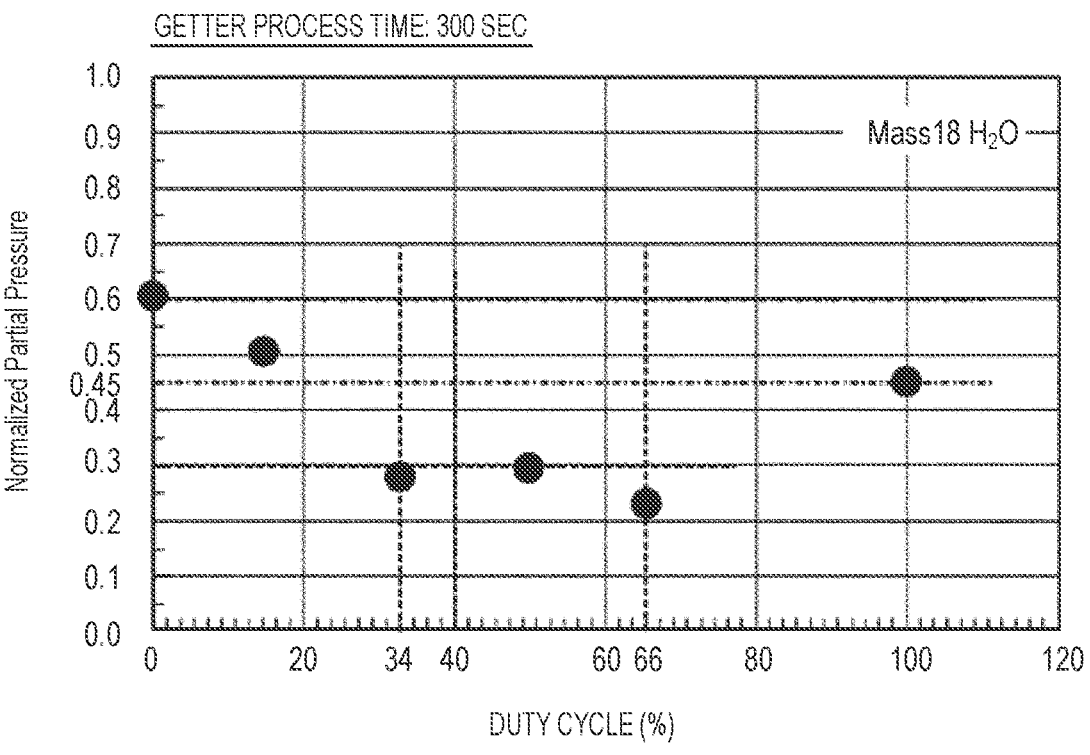
FIG. 18 is a diagram showing the relationship between the duty cycle and the partial pressure of water ($H_2O$) in the process chamber after the getter process when the film forming method of the first embodiment (example 1-2), the second embodiment (example 1-2, example 2-2, example 3-2) and the conventional process is used.

FIG. 18 is a diagram showing the relationship between the duty cycle in the getter process of the film forming method of example 1-2 of the first embodiment and example 1-2, example 2-2 and example 3-2 at the getter process time of 300 seconds and the partial pressure of water ($H_2O$) in the process chamber after the getter process. As shown in FIG. 18, the partial pressure of water ($H_2O$) is 0.6 when the duty cycle is 0% and the evacuation is performed without the getter process. As shown in FIG. 18, when the getter step is performed once with a duty cycle of 100%, the partial pressure of water ($H_2O$) is 0.45. On the other hand, when the getter step is repeated more than twice, the partial pressure of water ($H_2O$) in the process chamber is reduced, and the partial pressure of $H_2O$ becomes 0.3 or less in the range of the duty cycle from 34% to 66%, and the partial pressure of water ($H_2O$) is reduced to about ½ (0.3/0.6) as compared with the case of the duty cycle of 0%. Further, when the getter process is repeated more than twice, the partial pressure of water ($H_2O$) in the process chamber is reduced, and the partial pressure of water ($H_2O$) becomes 0.3 or less in the range of the duty cycle from 34% to 66%, and the partial pressure of water ($H_2O$) is reduced to about ⅔ (0.3/0.45) as compared with the case of the duty cycle of 100%.

When the getter process (example 1-1 and example 1-3 of the first embodiment and example 1-1, example 1-3, example 2-1, example 2-3, example 3-1, and example 3-3 of the second embodiment) of the other film forming method described above is performed, a material having a large getter effect can be formed to the gas or water ($H_2O$) remaining in the inner wall of the chamber of the process chamber 50 of the film forming area FFA and the magnetic pole of the ion gun, so that a better effect can be obtained than in the case shown in FIG. 18.

Figure 19:
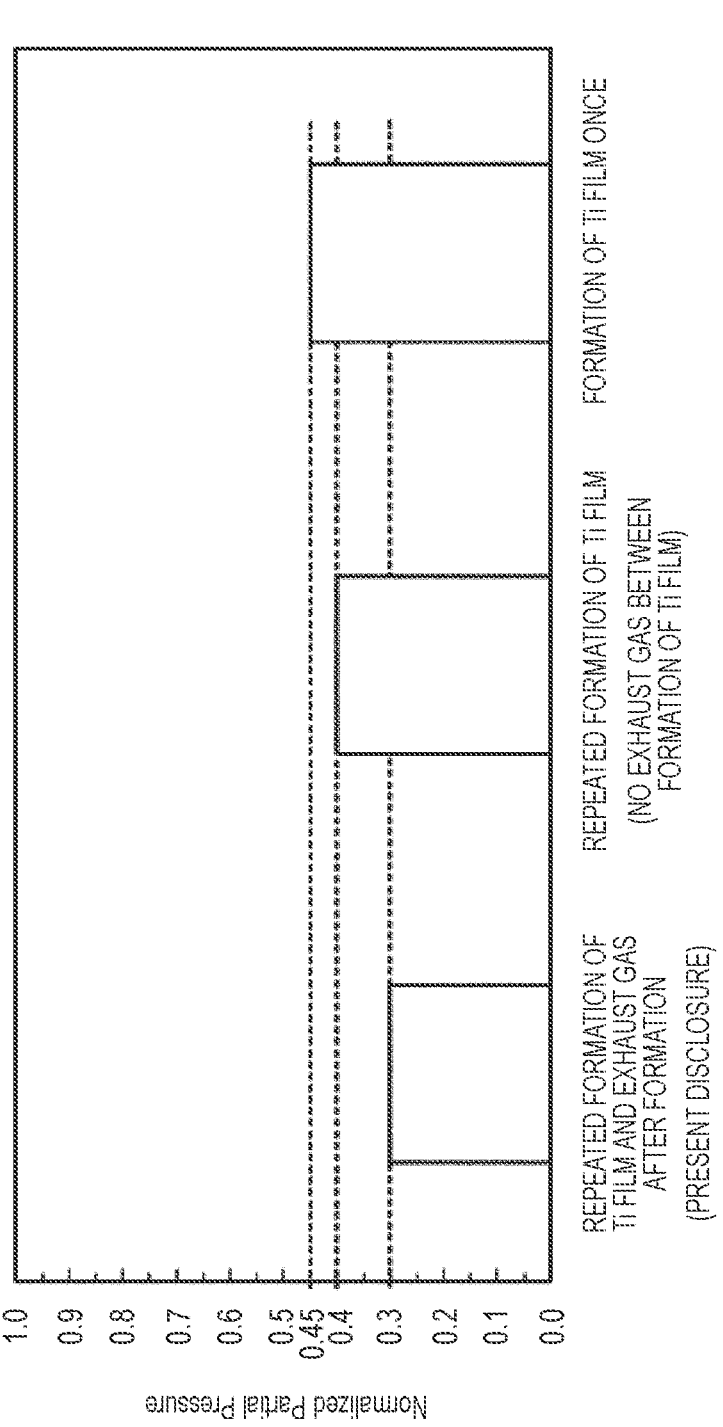
FIG. 19 is a diagram showing the relationship between the exhaust operation and the partial pressure of water ($H_2O$) in the process chamber when the film forming method of the first embodiment (example 1-2), the second embodiment (example 1-2, example 2-2, example 3-2) and the conventional process is used.

FIG. 19 is a diagram showing the relationship between the repeated operation and the exhaust operation in the getter process and the partial pressure of water ($H_2O$) in the process chamber of the film forming method of example 1-2 of the first embodiment, and example 1-2, example 2-2 and example 3-2 of the second embodiment. In the case of the process in which Ar gas is introduced into the process chamber and the Ti film is formed only once (right graph in FIG. 19), the partial pressure of water ($H_2O$) is 0.45. In the case of the process of intermittently repeating the forming of a Ti film while Ar gas is introduced into the process chamber (the graph in the center of FIG. 19 corresponds to Japanese Patent Application Laid-Open No. H02-050959), the partial pressure of water ($H_2O$) is 0.4. On the other hand, in the case of the getter process of the present invention (the left graph of FIG. 19) in which the getter step of forming a Ti film and exhausting the Ti film after forming the Ti film is repeated two or more times, the $H_2O$ partial pressure is 0.3 or less, and can be reduced to about ⅔ (0.3/0.45) as compared with the case of the process in which the Ar gas is introduced into the process chamber and the Ti film is formed only once (the right graph of FIG. 19), and to about ¾ (0.3/0.4) as compared with the case of the process in which the Ar gas is introduced into the process chamber and the Ti film is formed intermittently (the graph in the center of FIG. 19 corresponds to Japanese Patent Application Laid-Open No. H02-050959).

Thus, according to the present invention, the partial pressure of water ($H_2O$) is 0.3 or less, and the adhesion between the substrate S and the adhesive film can be improved without lowering productivity.

The preferred first and second embodiments of the present invention have been described above, but the present invention is not limited to the preferred first and second embodiments, and various modifications and modifications are possible within the scope of the gist thereof.

In the first and second embodiment, the getter material is described as Ti, but it is not limited to Ti, and a material having a large getter effect on oxygen and water, such as Ta, Zr, Cr, Nb and Mo, can be used. Two or more alloys having a large getter effect can also be used.

Although the adhesive film of the first and second embodiment has been described as a Ti film, it is not limited to a Ti film, and TiN, Ta, TaN, Ni, Cr, NiCr alloy, Ta alloy, Cu alloy, or the like can be used. Here, in consideration of productivity, since a Cu film is formed on the adhesive film as a seed film for stably growing the electrolytic Cu plating, a Cu alloy in which the adhesive film and the seed film can be removed together with a Cu etching solution is preferable as the adhesive film. Since the Cu alloy is not a material having a large getter effect with respect to oxygen and water, the material having a large getter effect is not loaded on the cathode when the Cu alloy is used as the adhesive film, but the getter process can be carried out without being limited to the sputter film type because the getter material supply source MS is provided in the present invention.

Although the seed films of the first and second embodiment have been described as Cu films, they are not limited to Cu films, and CuAl alloys, CuW alloys and the like can be used.

In FIG. 15 and FIG. 16, it is preferable to control the gas introduction device G1 in FIG. 1 or FIG. 9 and the exhaust device V50 in FIG. 1 or FIG. 9 so that the duty cycle D=P1/P of the third process and the fourth process is smaller than the duty cycle D=P1/P of the first process and the second process within the range of the duty cycle D=P1/P of 34% to 66%.

Further, in FIG. 15 and FIG. 16, it is preferable to control the gas introduction device G1 in FIG. 1 or FIG. 9 and the exhaust device V50 in FIG. 1 or FIG. 9 so that the duty cycle D=P1/P of the fifth process and the sixth process is smaller than the duty cycle D=P1/P of the third process and the fourth process within the range of the duty cycle D=P1/P of 34% to 66%.

Thus, the time P1 of the third process becomes smaller than the time P1 of the first process, and the time P1 of the fifth process becomes smaller than the time P1 of the third process, so that the time P2 of the fourth process becomes relatively larger than the time P2 of the second process, and the time P2 of the sixth process becomes larger than the time P2 of the fourth process.

Thereby, since the getter effect in the initial stage of the getter process in which the water ($H_2O$) partial pressure is high becomes large, it can be reached in a short time by a desired water ($H_2O$) partial pressure and productivity can be improved.

According to the film forming apparatus, the control apparatus of the film forming apparatus, and the film forming method according to the present invention, the adhesion between the substrate and the adhesive film can be improved without lowering productivity.

Other features and advantages of the present invention will become apparent from the following description with reference to the accompanying drawings. In the attached drawings, the same or similar configurations are given the same reference numerals.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

What is claimed is:

1. A control apparatus for controlling a film forming apparatus comprising:
   a process chamber;
   a processing unit provided in the process chamber configured to form an adhesive film;
   an exhaust unit capable of evacuating the process chamber; and
   a gas introduction unit introducing gas for forming the adhesive film in the process chamber,
   wherein the control apparatus further comprises a storing unit storing a control program,
   wherein the control program comprises:
      a first step of forming, on a surface of an inner wall of the process chamber, a material having a large getter effect on gas or water ($H_2O$) remaining in the process chamber;
      a second step of exhausting the process chamber for a predetermined period of time after the first step;
      a third step of forming, on the surface of the inner wall of the process chamber, the material having a large getter effect on gas or water ($H_2O$) remaining in the process chamber after the second step;
      a fourth step of exhausting the process chamber for a predetermined period of time after the third step; and
      an adhesive film forming step of forming the adhesive film on a substrate provided in the process chamber after the fourth step,
   wherein the exhaust unit and the gas introduction unit are controlled so that a duty cycle D=P1/P becomes 34% or more and 66% or less, when P1 is a time of the first step or the third step and P is a total time of the first step and the second step or a total time of the third step and the fourth step.

2. The control apparatus according to claim 1, wherein the introduced gas in the process chamber is started to be introduced into the process chamber at the same time as a start of the first step or the third step by using the gas introduction unit, and is stopped to be introduced into the process chamber at the same time as an end of the first step or the third step.

3. The control apparatus according to claim 1, wherein exhaust in the process chamber is started at the same time as a start of the first step by using the exhaust unit.

4. The control apparatus according to claim 1, wherein power supplied to the process chamber is started to be supplied into the process chamber at the same time as a start of the first step or the third step and is stopped to be supplied into the process chamber at the same time as an end of the first step or the third step by using a power supply unit.

5. The control apparatus according to claim 1, wherein the exhaust unit and the gas introduction unit are controlled so that a duty cycle D=P1/P of the third step and fourth step is smaller than a duty cycle D=P1/P of the first step and the second step within a range where the duty cycle D=P1/P of the third and fourth steps or of the first and second steps is 34% or more and 66% or less.

6. The control apparatus according to claim 1, wherein the material having a large getter effect on gas or water ($H_2O$) remaining in the process chamber is formed in the first step and the third step using an ion gun.

* * * * *